US010979071B2

(12) United States Patent
Dupont et al.

(10) Patent No.: US 10,979,071 B2
(45) Date of Patent: Apr. 13, 2021

(54) SYSTEMS AND METHODS FOR VARIABLE LENGTH CODEWORD BASED, HYBRID DATA ENCODING AND DECODING USING DYNAMIC MEMORY ALLOCATION

(71) Applicant: Cyborg Inc., New York, NY (US)

(72) Inventors: Nicolas Thomas Mathieu Dupont, New York, NY (US); Alexandre Helle, New York, NY (US)

(73) Assignee: Cyborg Inc., New York, NY (US)

( * ) Notice: Subject to any disclaimer, the term of this patent is extended or adjusted under 35 U.S.C. 154(b) by 0 days.

(21) Appl. No.: 16/691,496

(22) Filed: Nov. 21, 2019

(65) Prior Publication Data
US 2020/0235750 A1    Jul. 23, 2020

Related U.S. Application Data

(63) Continuation of application No. 16/250,345, filed on Jan. 17, 2019, now Pat. No. 10,491,240.

(51) Int. Cl.
*H03M 13/00* (2006.01)
*H03M 7/38* (2006.01)
(Continued)

(52) U.S. Cl.
CPC ...... *H03M 7/3046* (2013.01); *G06F 16/9014* (2019.01); *H03M 7/30* (2013.01);
(Continued)

(58) Field of Classification Search
CPC .... H03M 7/40; H03M 7/4037; H03M 7/4093; H03M 7/3046; H03M 7/30;
(Continued)

(56) References Cited

U.S. PATENT DOCUMENTS 3,701,108 A    10/1972   Loh et al.
4,748,638 A     5/1988   Friedman et al.
(Continued)

OTHER PUBLICATIONS

Office Action for U.S. Appl. No. 16/274,417, dated Nov. 15, 2019, 23 pages.
(Continued)

*Primary Examiner* — Kyle Vallecillo
*Assistant Examiner* — Osman M Alshack
(74) *Attorney, Agent, or Firm* — Cooley LLP

(57) ABSTRACT

A data encoding system includes a non-transitory memory, a processor, a digital-to-analog converter (DAC) and a transmitter. The non-transitory memory stores a predetermined file size threshold. The processor is in operable communication with the memory, and is configured to receive data. The processor detects a file size associated with the data. When the file size is below the predetermined file size threshold, the processor compresses the data using a variable length codeword (VLC) encoder. When the file size is not below the predetermined file size threshold, the processor compresses the data, using a hash table algorithm. The DAC is configured to receive a digital representation of the compressed data from the processor and convert the digital representation of the compressed data into an analog representation of the compressed data. The transmitter is coupled to the DAC and configured to transmit the analog representation of the compressed data.

10 Claims, 19 Drawing Sheets

(51) Int. Cl.
*H04N 19/91* (2014.01)
*G06F 16/901* (2019.01)
*H03M 7/30* (2006.01)
*G06N 20/00* (2019.01)

(52) U.S. Cl.
CPC ............. *H04N 19/91* (2014.11); *G06N 20/00* (2019.01); *H03M 13/6318* (2013.01)

(58) Field of Classification Search
CPC .......... H03M 1/1038; H03M 13/6312; H03M 13/6318; H04N 19/91; G06F 16/9014; G06F 17/30949; G06N 20/00
USPC ........................................ 714/752, 759, 779
See application file for complete search history.

(56) References Cited

U.S. PATENT DOCUMENTS

| | | | |
|---|---|---|---|
| 5,016,009 A | | 5/1991 | Whiting et al. |
| 5,883,588 A | | 3/1999 | Okamura |
| 6,298,087 B1 * | 10/2001 | Luna ...................... H04N 19/61 375/240.03 | |
| 6,304,676 B1 | 10/2001 | Mathews | |
| 6,714,145 B1 | 3/2004 | Marques | |
| 9,338,456 B2 * | 5/2016 | Karczewicz ............ H04N 19/91 | |
| 9,516,316 B2 * | 12/2016 | Karczewicz ............ H04N 19/61 | |
| 9,584,155 B1 | 2/2017 | Gopal et al. | |
| 9,729,169 B2 * | 8/2017 | Kalevo ............... H03M 7/6058 | |
| 10,491,240 B1 | 11/2019 | Mathieu et al. | |
| 2002/0015533 A1 * | 2/2002 | Nakamura ............. H04N 19/89 382/245 | |
| 2003/0118240 A1 * | 6/2003 | Satoh ................... H04N 19/176 382/239 | |
| 2003/0202582 A1 * | 10/2003 | Satoh ................... H04N 19/152 375/240.03 | |
| 2004/0120404 A1 * | 6/2004 | Sugahara ................ H03M 7/40 375/240.23 | |
| 2005/0015248 A1 * | 1/2005 | Kadono ................. H04N 19/61 704/230 | |
| 2008/0089404 A1 * | 4/2008 | Okazaki ............... H04N 19/142 375/240 | |
| 2009/0102686 A1 | 4/2009 | Fukuhara et al. | |
| 2010/0172583 A1 * | 7/2010 | Shimauchi ........... H04N 19/176 382/166 | |
| 2010/0223237 A1 | 9/2010 | Mishra et al. | |
| 2011/0109485 A1 | 5/2011 | Kataoka et al. | |
| 2012/0099655 A1 * | 4/2012 | Niemi .................... H04N 19/93 375/240.23 | |
| 2013/0002458 A1 | 1/2013 | Moriya | |
| 2013/0013301 A1 | 1/2013 | Subbaraman et al. | |
| 2013/0226594 A1 | 8/2013 | Fuchs et al. | |
| 2014/0085115 A1 | 3/2014 | Beier et al. | |
| 2014/0223029 A1 | 8/2014 | Bhaskar et al. | |
| 2015/0032705 A1 | 1/2015 | Ideuchi et al. | |
| 2016/0087647 A1 | 3/2016 | Fenney | |
| 2016/0088313 A1 | 3/2016 | Fenney | |
| 2018/0041224 A1 | 2/2018 | Setty | |
| 2018/0225040 A1 * | 8/2018 | Dupont ................... H03M 7/55 | |
| 2019/0110056 A1 | 4/2019 | Fenney | |
| 2019/0205745 A1 * | 7/2019 | Sridharan ............. G06F 9/5061 | |

OTHER PUBLICATIONS

International Search Report for International Application No. PCT/US2020/013857, dated Apr. 15, 2020, 2 pages.

Written Opinion for International Application No. PCT/US2020/013857, dated Apr. 15, 2020, 8 pages.

David Salomon, Giovanni Motta: "Handbook of Data Compression, Fifth Edition", 2010, Springer, pp. 361-364.

David Salomon, Giovanni Motta: "Handbook of Data Compression, Fifth Edition", 2010, Springer, pp. 234-238.

* cited by examiner

SYSTEMS AND METHODS FOR VARIABLE LENGTH CODEWORD BASED, HYBRID DATA ENCODING AND DECODING USING DYNAMIC MEMORY ALLOCATION

CROSS-REFERENCE TO RELATED APPLICATIONS

This application is a continuation of U.S. patent application Ser. No. 16/250,345, filed Jan. 17, 2019 and titled "Systems and Methods for Variable Length Codeword Based, Hybrid Data Encoding and Decoding Using Dynamic Memory Allocation," the entire contents of each of which are incorporated herein by reference in their entirety.

FIELD

The present disclosure relates to systems and methods for compressing and decompressing data, for example to increase an effective capacity of storage media or to decrease the bandwidth used for transmitting data over a communications medium.

BACKGROUND

As storage capacity/network bandwidth have increased, so has its demand. One approach to accommodating this increased demand is through data compression.

SUMMARY

Methods, systems and apparatuses for hybrid encoding and decoding of binary data are disclosed. In some embodiments, a data encoding system includes a non-transitory memory, a processor, a digital-to-analog converter (DAC) and a transmitter. The non-transitory memory stores a predetermined file size threshold. The processor is in operable communication with the memory, and is configured to receive a first data. The processor detects a file size associated with the first data. When the file size is below the predetermined file size threshold, the processor compresses the first data using a variable length codeword (VLC) encoder, to generate a second data. When the file size is not below the predetermined file size threshold, the processor compresses the first data using a hash table algorithm, to generate a second data. The DAC is configured to receive a digital representation of the second data from the processor and convert the digital representation of the second data into an analog representation of the second data. The transmitter is coupled to the DAC and is configured to transmit the analog representation of the second data.

In some embodiments, a method includes receiving a first data, and selecting one of a VLC encoder or a hash table algorithm from a memory, based on a size of the first data, the memory storing both the VLC encoder and the hash table. The method also includes transforming, using the selected one of the VLC encoder or the hash table algorithm, the first data into a second data including a compressed version of the first data. The method also includes sending a digital representation of the second data to a converter that causes the second data to be transmitted (e.g., via one or more of a wireless transmission, a wired transmission, or an optical transmission) after receiving the second data. When the VLC encoder is selected, the method can also include storing an uncompressed version of the first data.

Example features, structure and operation of various embodiments are described in detail below with reference to the accompanying drawings.

DETAILED DESCRIPTION

Figure 1A:
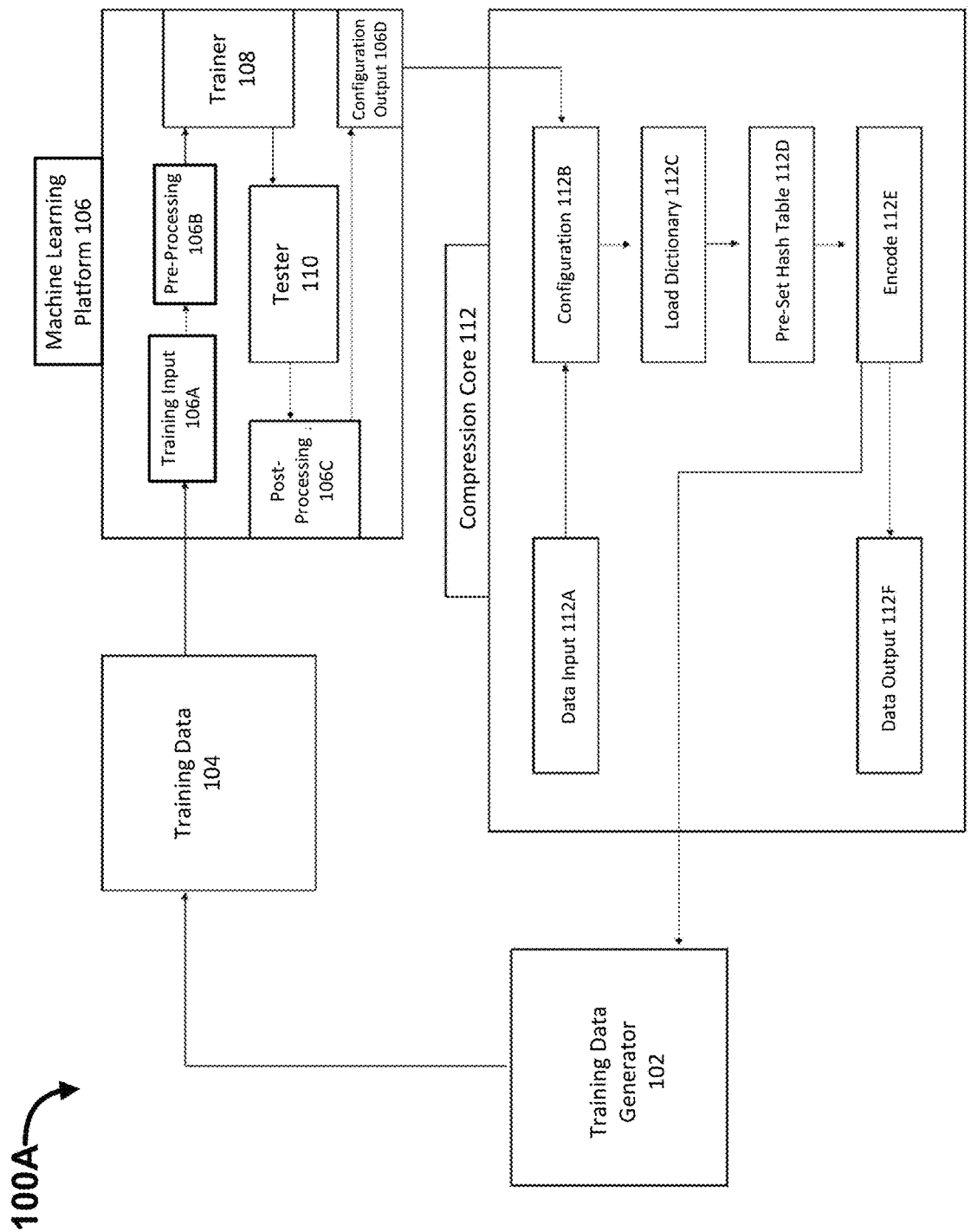
FIG. 1A is a system block diagram for a data compression system, according to some embodiments.

It seems that the more storage capacity/network bandwidth that exist, the more a "need" exists and the more useful data compression becomes. Data compression techniques can be divided into two major categories: lossy and lossless. Lossless data compression techniques are employed when it is particularly important that no information is lost in the compression/decompression process. Lossy data compression techniques are typically employed in processing applications such as the transmission and storage of digital video and audio data that can tolerate some information loss (e.g., since human vision is forgiving of potential artifacts). Lossy data compression techniques typically yield greater compression ratios than their lossless counterparts. Over the past 30 years, lossy data compression methods have gained tremendous importance for their use in video conferencing, streaming to a wide variety of devices, and home entertainment systems. Most other applications employ lossless data compression techniques.

For applications using data types such as video, it is possible to achieve compression ratios of 150:1 for Quarter Common Intermediate Format (QCIF) @15 fps over 64 Kbps (typically used in wireless video telephony applications) or 1080P High Definition (HD) @60 fps at 20 Mbps over broadband networks. These applications typically use the modern International Telecommunication Union (ITU) H.264 video compression standard, resulting in high quality video. However, for data types/files such as documents, spreadsheets, database files, etc., lossless data compression is generally strongly preferred. Compression ratios for lossless methods are typically much lower than those for lossy methods. For example, lossless compression ratios canrange from 1.5:1 for arbitrary binary data files, to 3.0:1 for files such as text documents, in which there is substantially more redundancy.

Transmitting compressed data takes less time than transmitting the same data without first compressing it. In addition, compressed data uses less storage space than uncompressed data. Thus, for a device with a given storage capacity, more files can be stored on the device if the files are compressed. As such, two of the primary advantages for compressing data are increased storage capacity and decreased transmission time.

Embodiments of the present disclosure set forth novel methods for accomplishing data compression in lossless and/or lossy contexts. For example, methods, systems and apparatuses for hybrid encoding and decoding of binary data are disclosed. In some embodiments, a data encoding system includes a non-transitory memory, a processor, a digital-to-analog converter (DAC) and a transmitter. The non-transitory memory stores a predetermined file size threshold. The processor is in operable communication with the memory, and is configured to receive a first data. The processor detects a file size associated with the first data. When the file size is below the predetermined file size threshold, the processor compresses the first data using a variable length codeword (VLC) encoder, to generate a second data. When the file size is not below the predetermined file size threshold, the processor compresses the first data, using a hash table algorithm, to generate a second data. The DAC is configured to receive a digital representation of the second data from the processor and convert the digital representation of the second data into an analog representation of the second data. The transmitter is coupled to the DAC and is configured to transmit the analog representation of the second data.

Overview of Lossless Data Compression Techniques

Data compression techniques typically employ a branch of mathematics known as information theory. Data compression is linked to the field of information theory because of its concern with redundancy. If the information represented/encoded by a message is redundant (where redundant information is defined as information whose omission does not reduce the information encoded in the output file), the message can be shortened without losing the information it represents.

Entropy (or "Shannon entropy") is a term that can be used to convey how much information is encoded in a message. A message having high entropy may be said to contain more information than a message of equal length/size having low entropy. The entropy of a symbol in a message can be defined as the negative logarithm of its probability of occurrence in the message. The information content of a character, in bits, is expressed as the entropy using base-two logarithms:

$$E_{symbol}(X) = -\log_2(\text{probability of symbol}(X))$$

where:
$E_{symbol}(X)$ Entropy of a given symbol in a message
X=message

The entropy of an entire message, which is equivalent to the average minimum number of bits (H(X)) used to represent a symbol, is the sum of the entropy of each symbol occurring in the message:

$$H(X) = -\sum_{i=1}^{n} P_i \cdot \log2(P_i)$$

Given a symbol set {A, B, C, D, E}, where the symbol occurrence frequencies ($P_i$) are:
{A=0.5 B=0.2 C=0.1 D=0.1 E=0.1},
the average minimum number of bits used to represent one of these symbols is:
$H(X)=[-(0.5 \log_2(0.5)+0.2 \log_2(0.2)+(0.1 \log_2(0.1)*3)]$
$H(X)=-[-0.5+(-0.46438)+(-0.9965)]$
$H(X)=-[-1.9]$
$H(X)=1.9$ Rounding up gives 2 bits/per symbol. Thus, as an example, a 10 character string, AAAAABBCDE is optimally encoded using 20 bits. Such encoding would allocate fewer bits to the more frequently occurring symbols (e.g., A and B) and longer bit sequences to infrequent symbols (C, D, E).

Although in the foregoing example, from A Guide to Data Compression Methods by Solomon (2013), the contents of which are incorporated by reference herein in their entirety for all purposes, the frequency of the symbols happens to match their frequency in the string, this will often not be the case in practice, Thus, there are two ways to apply the Shannon entropy equation (which provides a lower bound for the compression that can be achieved):

Approach 1: The symbols in a set have known frequencies. These frequencies may or may not correspond to the frequencies in a message. As an example, consider that characters in a message each have an average frequency. The number of bits per character can be calculated using the Shannon entropy equation.

Approach 2: Symbol frequencies are calculated for a message. The Shannon entropy equation can then be applied to calculate the number of bits per symbol for that message.

A variant on the above technique, known as dictionary coding, uses a slightly different approach to data compression. In approaches using dictionary coders (also referred to as "substitution coders"), one or more portions of the data to be compressed is first scanned to determine which characters, or character strings, occur most frequently. The identified Characters, and character strings, are placed in a dictionary and assigned predetermined codes having code lengths that are inversely proportional to the probability of occurrence of the characters, or character strings. The characters and character strings are read from the data file, matched up with their appropriate dictionary entry, and coded with the appropriate code. A variant of the dictionary coding scheme adapts the dictionary based on changing frequencies of occurrence of characters and character strings in the data. A few of these dictionary-based algorithms are described in further detail below.

In addition to dictionary coding, two known, pioneering lossless data compression methods are Huffman coding and arithmetic coding. These methods are considered near-optimal according to Shannon's theorem (also referred to as the "noisy-channel coding theorem"), with arithmetic coding typically having a slight edge over Huffman encoding in terms of compression ratio. However, Huffman coding is significantly more efficient in terms of encoding/decoding times than arithmetic encoding.

Figure 2:
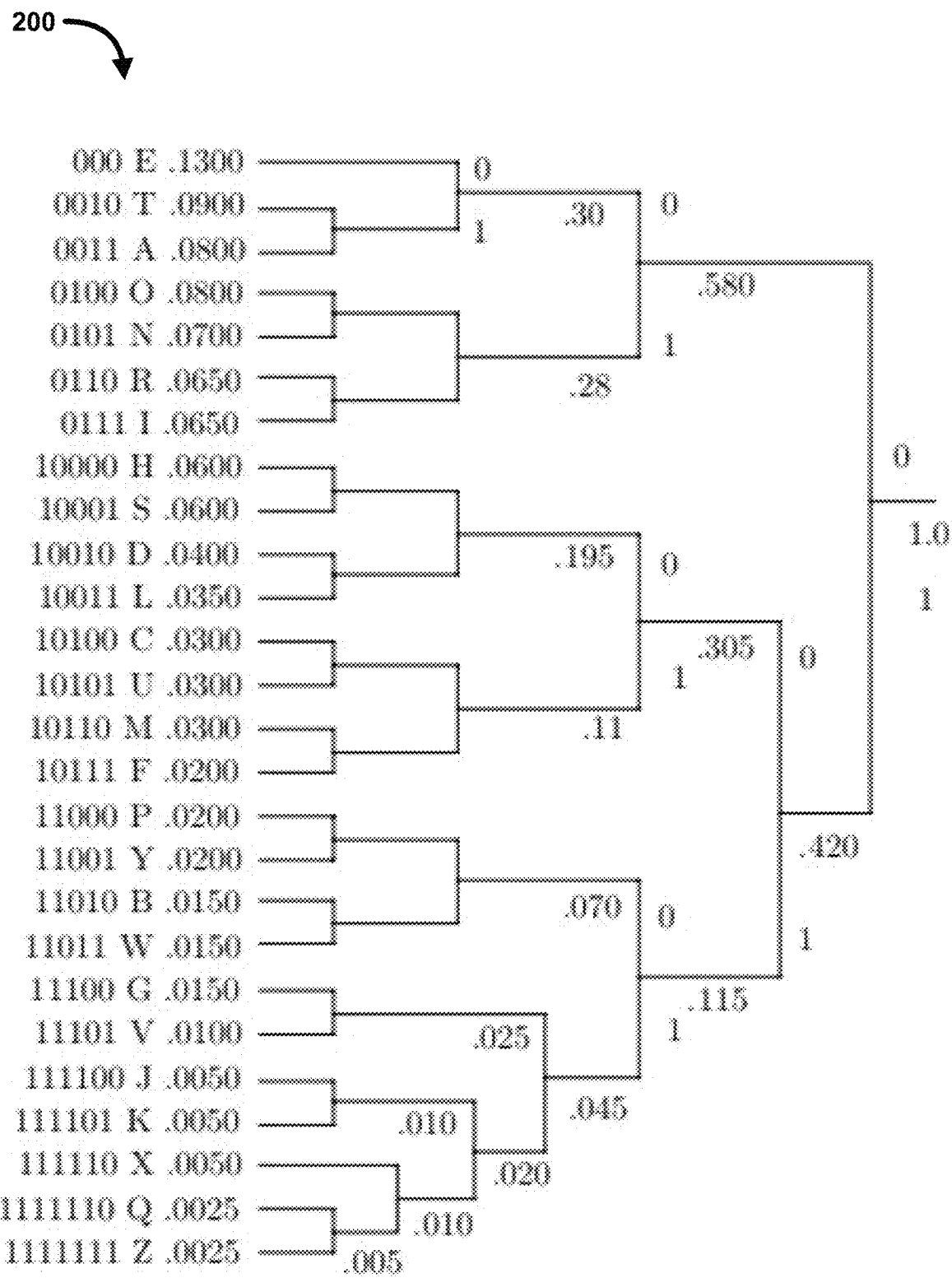
FIG. 2 is an example of a Huffman Tree.

Huffman coding is based on the frequency of occurrence of a symbol within a given message. The principle is to use a lower number of bits to encode the data that occurs more frequently. The average length of a Huffman code depends on the statistical frequency with which the source produces each symbol from its syllabary. A Huffman code dictionary, which associates each data symbol with a codeword, has the property that no codeword in the dictionary is a prefix of any other codeword in the dictionary. The basis for this coding is a code tree that assigns short codewords to frequently occurring symbols and long codewords to symbols that are rarely used. An example Huffman tree is provided in FIG. 2.

Arithmetic coding bypasses the idea of replacing an input symbol with a specific code. Instead, it takes a stream of input symbols and replaces it with a single floating-point number in the range of 0 to 1. The number of bits used to encode each symbol varies according to the probability assigned to that symbol. Low probability symbols may use many bits, while high probability symbols use fewer bits. During arithmetic coding, each symbol is assigned to an interval. Starting with the interval [0 . . . 1), each interval is divided into several subintervals having sizes proportional to the probability of their corresponding symbols.

The subinterval from the coded symbol is then taken as the interval for the next symbol. The output is the interval of the last symbol. Arithmetic coding is model-based, in that it relies on a model to characterize the symbols it is processing (i.e., to tell the encoder what the probability of a symbol is in the message). If the model produces an accurate probability of the symbols in the message, the symbols will be encoded very close to optimally. If, however, the model produces an inaccurate probability of the symbols in the message, the encoder may actually increase the size of the message, rather than compress it.

Figure 3:
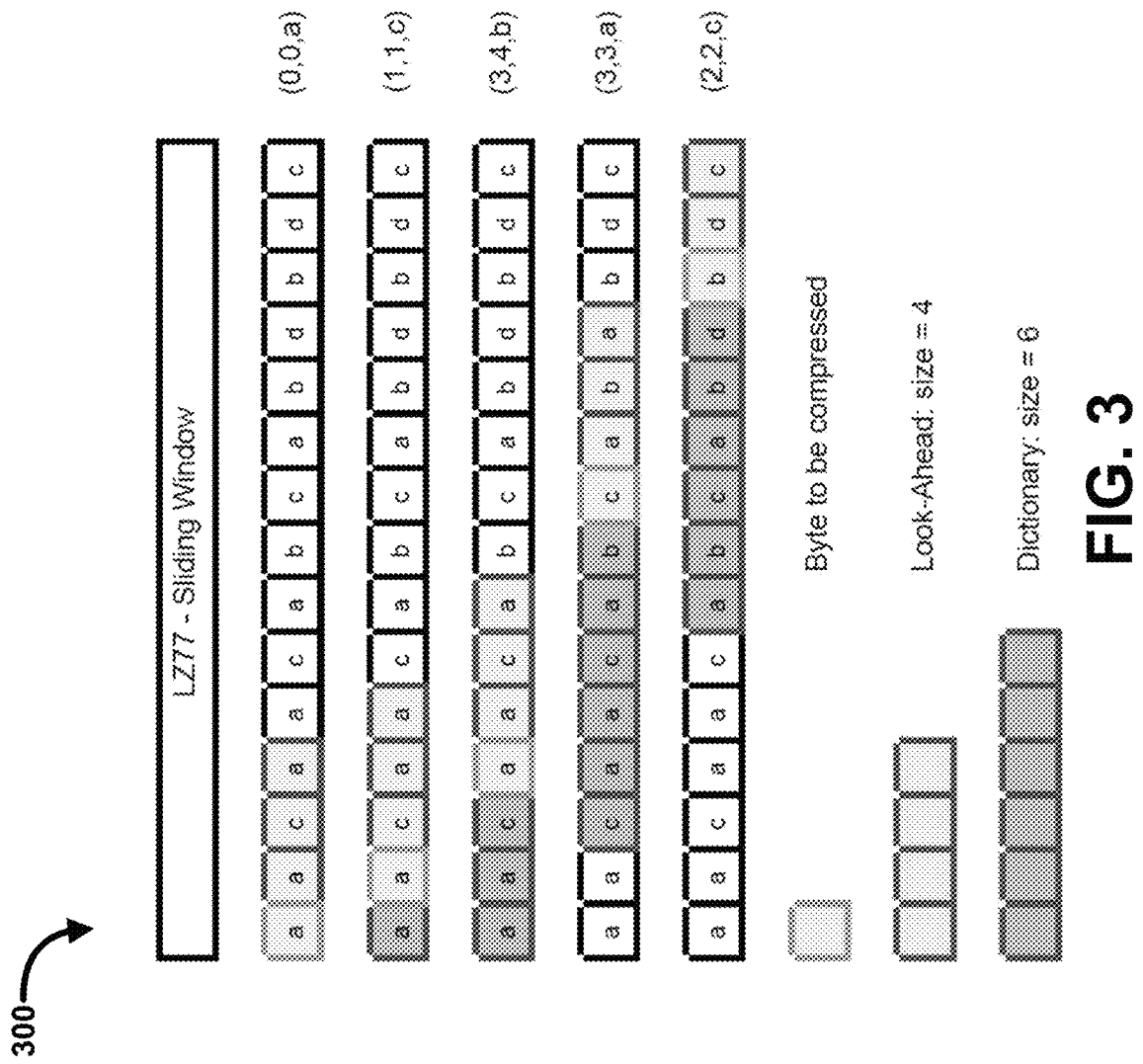
FIG. 3 is an example of a dictionary coding algorithm for data compression.

A popular dictionary coding algorithm, known as LZ77, was published in "A Universal Algorithm for Sequential Data Compression," IEEE Transactions on Information Theory (May 2, 1977) by Abraham Lempel and Jacob Ziv, the content of which is incorporated by reference herein in its entirety for all purposes. The LZ77 algorithm uses a sliding window across the data to be compressed. The window contains a dictionary, a byte to be compressed and a "look ahead buffer" that slides to the right, as shown in FIG. 3. The LZ77 encoding produces a tuple containing the offset ("O") in the dictionary from the byte to be compressed, the length ("L") of the number of matching bytes between the dictionary and the look-ahead buffer, and the next byte ("N") to be compressed, as represented by (O, L, N) (see right-hand column in FIG. 3). Typically, the LZ77 algorithm uses 12 bits to represent the size of the dictionary, 4 bits to represent the look-ahead buffer, and 8 bits to represent the next byte to be compressed. Thus, the tuple has a size of 3 bytes.

As shown in the first row of FIG. 3, there is initially no dictionary, so there can be no match. This is represented by a tuple that has 0 for the offset, 0 for the length and the actual byte to be compressed ("a"). This byte ("a") is added to the dictionary. For all lengths L, the window slides to the right by length L plus one bytes. So, in FIG. 3, the window slides to the right by one byte and "a" is added to the dictionary. Next, when the byte to be compressed, "a" on the second row, is compared with the byte "a" in the library, there is a match. This is represented in the associated tuple as 1 for the offset O, 1 for the length L, and "c" for the next byte to be compressed. The window then slides two bytes to the right. The third row illustrates a case in which the match extends into the look-ahead buffer: "a,a,c,a" matches the identical string in the look-ahead buffer and the tuple is: (3,4,b). Continuing on the fourth row, note that the window slides five bytes to the right due to the length of the tuple on the third row. The decoder maintains a dictionary that is identical to the encoder's dictionary. During decoding, each tuple is decoded into its corresponding one or more bytes, which can then be added to the dictionary.

One of many algorithms derived from LZ77 is known as the Lempel-Ziv-Welch (LZW) algorithm. It was originally developed by Ziv and Lempel, and was subsequently improved by Welch. Popular text compressors such as "Zip" and the Unix file compression utility "Compress" are based on LZW. LZW is also used in the popular GIF image format. Although the compression ratios achieved with LZW are lower than those for other compression algorithms, such as Huffman and arithmetic encoding discussed above, it remains popular due to its ease of implementation. LZW compression uses a code table, for example including 4096 codes. Codes 0-255 in the code table are assigned to represent single bytes from the input message. When encoding begins, the code table contains only the first 256 entries, with the remainder of the table being blank/empty. Compression is then accomplished using codes 256 through 4095, to represent the sequences of bytes. As the encoding proceeds, LZW identifies repeated sequences in the message, and adds them to the code table. Decoding is later performed by reading each code from the compressed file and translating it based on the code table, to identify the character or characters it represents.

A variety of other lossless data compression methods are set forth, for example, in History of Lossless Data Compression Algorithms, 2014, accessible at https://ethw.org/History_of_Lossless_Data_Compression_Algorithms, the content of which is incorporated by reference herein in its entirety for all purposes.

Hybrid Coder/Decoder (CODEC)

Encoders of the present disclosure compress data using a hybrid hash table/Variable Length Codeword (VLC) encoder, to achieve levels of data compression that are understood to have heretofore never been accomplished. The hybrid encoder invokes one of at least two algorithms, e.g., selected empirically based on the file size of the data to be compressed. Files determined to have a small size are compressed using the VLC algorithm, and files determined to have a large size are compressed using the hash table algorithm. Methods, systems and apparatus are disclosed herein for reducing the size of strings of binary data. In some embodiments, a method of removing redundancy from a stream of binary data includes parsing a predetermined number of bits from a received stream of binary data, and assigning either hash table or VLC codewords to segments extracted from the binary data. In other embodiments, a method of compressing a stream of binary data can include parsing a predetermined number of bits from a received stream of binary data, and assigning either fixed-length or variable-length codewords to symbols extracted from the binary data. In both such embodiments, the system is adaptive in that the hash table encoder's dictionary is updated for each codeword produced, and the VLC's table is tuned based on the statistics of the symbols in the stream of binary data. The hash table algorithm assigns a fixed length hash to a programmable number (e.g., four or more) of input bytes, thereby improving the compression ratio. The VLC encoder replaces input bytes with codewords, where short codewords are substituted for the most frequently occurring bytes, and longer codewords are substituted for less frequently occurring symbols. Systems of the present disclosure can also include decoders, and methods for decompressing and reproducing a copy of the original, uncompressed strings of binary data are also set forth herein.

In some embodiments, a system includes at least a processor, a memory, and a CODEC for compressing/decompressing, respectively, a raw or compressed data stream received from or originating from a file or network. The system is configured to receive a binary string of data and partition the binary string into one or more binary segments prior to compression. The system then compresses the binary segments using a hybrid hash table/VLC encoder. In other words, the hybrid encoder includes both a hash table encoder and a encoder. The hash table encoder compresses data by assigning fixed length codewords to one or more bytes of the input (binary segment) data. The VLC encoder assigns short codewords to frequently occurring bytes of the input data, and assigns longer codewords to less frequently occurring bytes. The output of both the hash table encoder and the VLC encoder can be saved to a file and/or transmitted via wired or wireless network transmission. The system can also include a decoder configured to receive hybrid Hash Table/VLC encoded bitstreams from a file or network, and to reproduce a binary string of data identical to the binary string of data that was originally input to the encoder. The system can optionally interface with a machine learning platform.

FIG. 1A is a system block diagram for a data compression system, according to some embodiments. As shown in FIG. 1A, the data compression system 100A includes a machine learning platform 106 in wired and/or wireless network communication with a compression core 112. One or both of the machine learning platform 106 and the compression core 112 can include a processor and a memory operatively coupled to the processor, where the processor is configured to perform steps (e.g., by reference to instructions stored in the memory). The compression core 112 is configured to communicate with the training data generator 102 and/or the machine learning platform 106. The compression core 112 is configured to receive data input 112A, which is subsequently encoded (at 112E) based on one or more of: configuration data 112B, one or more dictionaries 112C, or a pre-defined hash table 112D. The encoding can include compression, as discussed further below, and can include partitioning the data input 112A into multiple data segments. Alternatively, the data input 112A can be partitioned into multiple data segments by the compression core prior to the encoding. The encoded/compressed data is then output, as data output 112F, and may be stored within the compression core 112 and/or transmitted (e.g., via wireless network communication). The encoded/compressed data can also be fed to a training data generator 102, which uses the encoded/compressed data to generate training data 104. The training data generator 102 may reside locally with the compression core 112 (e.g., housed within the same compute device), or may be in wired or wireless communication with the compression core 112. The training data generator 102 can gather log data from encoder/decoder operations, order the log data, and/or place the log data into a structured file format (e.g., a comma-separated variable file, or .csv file). The training data 104 can be sent to the machine learning platform 106 and be received therein, as training input 106A. The machine learning platform 106 performs pre-processing 106B on the training input 106A, and sends the pre-processed training input to a trainer 108 (e.g., a software module configured to generate predictive data). The trainer 108 and tester 110 can be built from one or more linear-regression machine learning libraries. Predictions generated by the trainer 108 based on the pre-processed training input are sent to a tester 110 for testing, and post-processing 106C (e.g., adjustments to predictive algorithms) is performed based on the outcome of the testing. Adjustments can then be made to configuration data, based on the post-processing 106C, before the configuration data is sent as configuration output 106D to the compression core. Pre-processing 106B and post-processing 106C functions can include applying one or more statistical methods to reduce noise and inconsistency in the data. Although the data compression system 100A of FIG. 1A is shown and described as being configured to perform compression, a similar system can also be used for decompression, where the input data is instead compressed data, and encode 112E is replaced with a decoding process. A hybrid decoder can, for example, detect an encoding of a received compressed data, and decode/decompress the compressed data using either a hash decoder or a VLC decoder (discussed further below) based on the detected encoding of the received compressed data. In some such implementations, the hybrid decoder is configured to wait until a predetermined number of symbols have been received and/or stored before decoding/decompressing the compressed data into an uncompressed data.

Figure 1B:
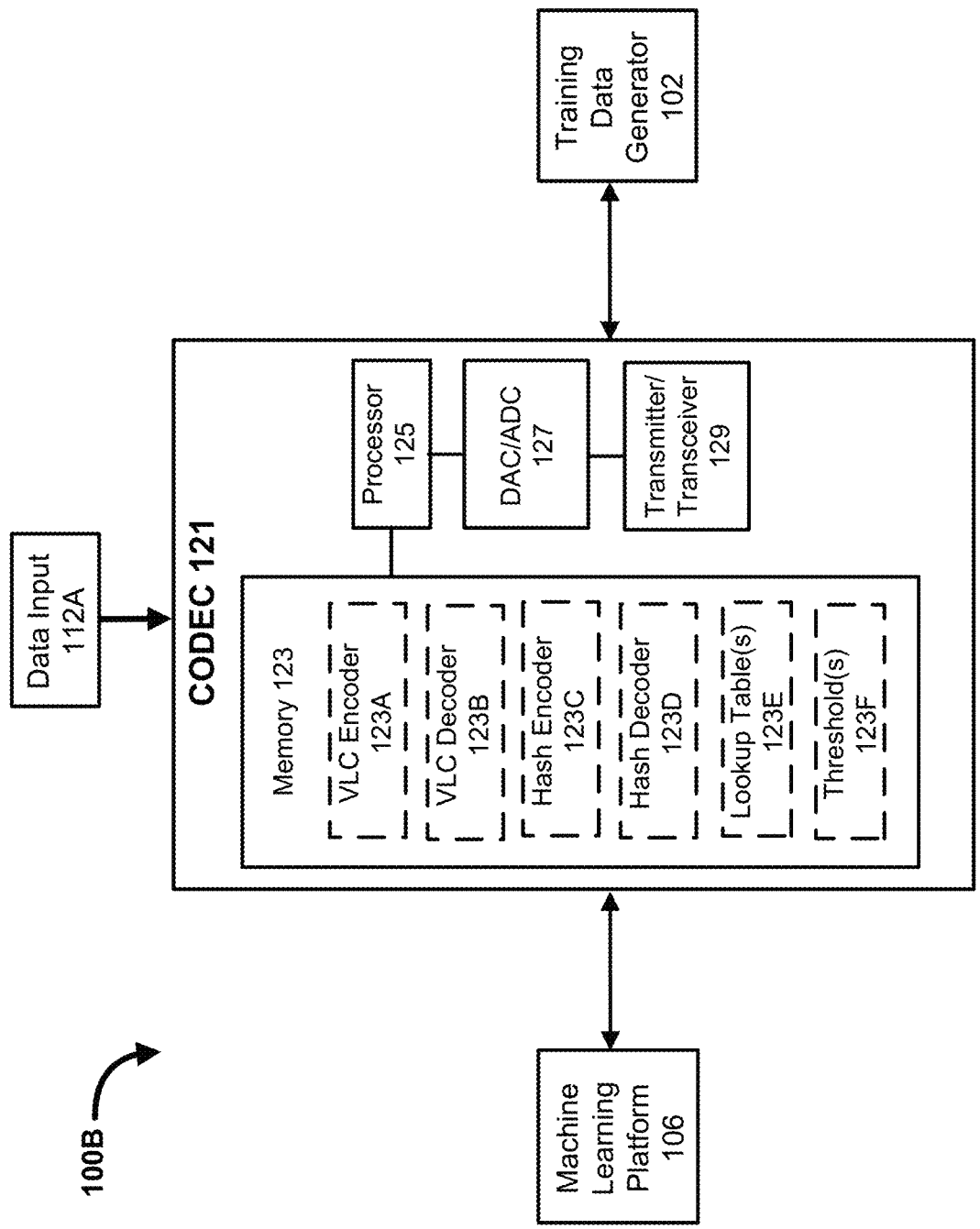
FIG. 1B is a system block diagram for a coder/decoder (CODEC), according to some embodiments.

FIG. 1B is a system block diagram for a coder/decoder (CODEC), according to some embodiments. As shown in FIG. 1B, a CODEC system 100B includes a CODEC 121, a machine learning platform 106, and a training data generator 102. The CODEC system 100B is similar to the data compression system 100A of FIG. 1A, with the exception that the data input 112A is received at the CODEC 121 (rather than a compression core), and the CODEC 121 is configured to perform compression and decompression of data. The CODEC 121 includes a memory 123, operably coupled to a processor 125. The processor 125 is operably coupled to a digital-to-analog converter (DAC) and analog-to-digital converter (ADC) 127, which in turn is coupled to a transmitter/transceiver 129 including one or more of: an antenna, a coaxial cable, or an optical fiber, for communication with the training data generator 102 and/or the machine learning platform 106. The memory 123 includes one or more of: a VLC encoder 123A, a VLD decoder 123B, a hash encoder 123C, a hash decoder 123D, VLC and/or hash table(s) (collectively, "lookup tables") 123E, and other data, such as data size threshold(s) 123F, relevant to compression and decompression (coding and decoding) actions, as discussed further below.

Figure 4:
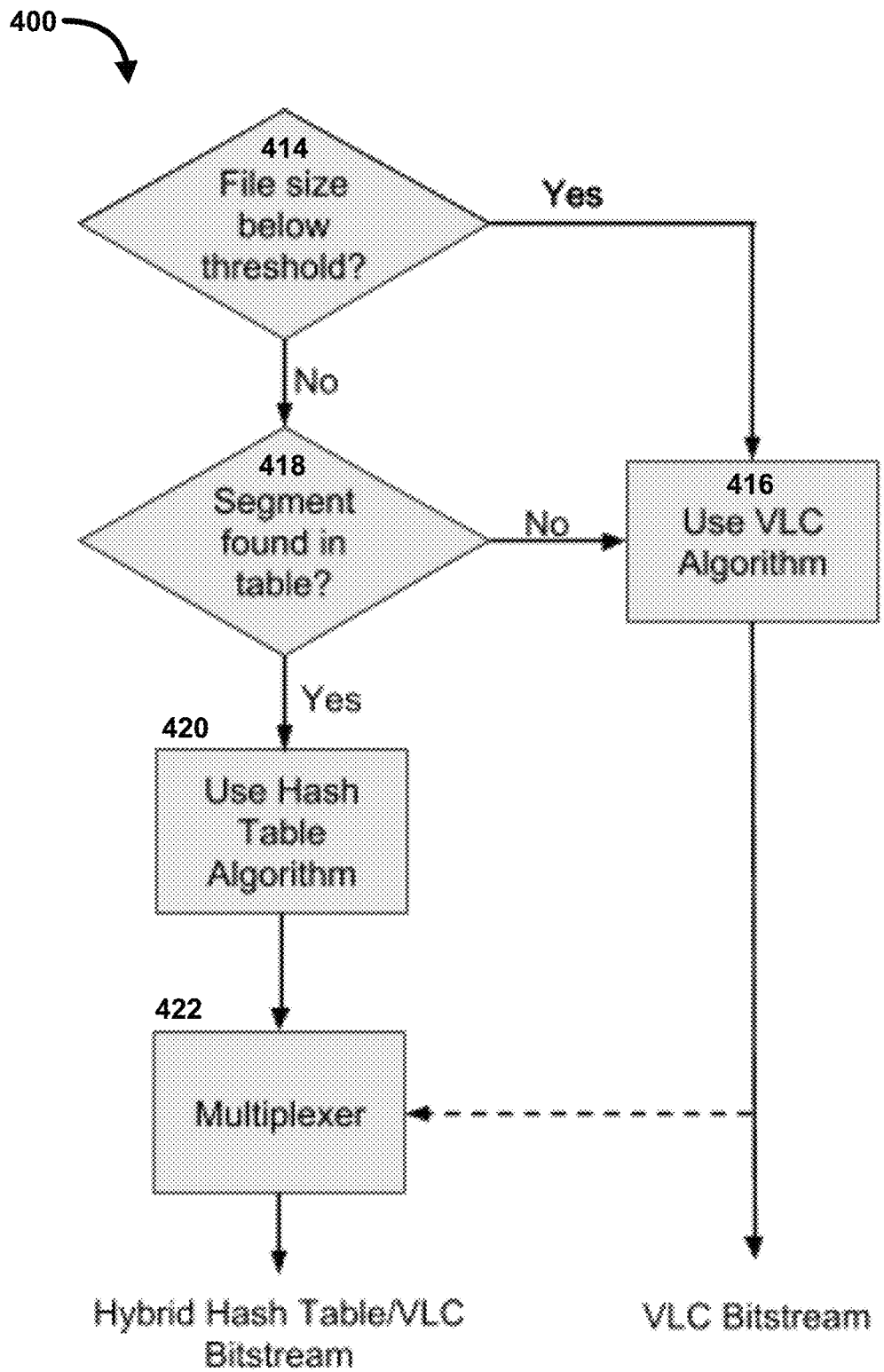
FIG. 4 is a flow diagram illustrating a hybrid data encoding/compression process, according to some embodiments.

FIG. 4 is a flow diagram illustrating a hybrid data encoding/compression process, according to some embodiments. As shown in FIG. 4, the hybrid data encoding/compression process 400 begins with detecting, at 414, whether the file size of an incoming data input or data segment is above or below a predetermined threshold size. If, at 414, the file size of the incoming data segment is below the predetermined threshold size, the process 400 proceeds to apply a VLC algorithm at 416 to accomplish the data encoding/compression. If, at 414, the file size of the incoming data segment is at or above the predetermined threshold size, the process 400 proceeds to a lookup event, at 418, during which a query of a hash table, based on the data segment, is performed. If, at 418, the data segment is not found in the hash table, the process 400 proceeds to apply the VLC algorithm at 416 to accomplish the data encoding/compression. If, at 418, the data segment is found in the table, the process 400 proceeds to apply a hash table algorithm 420 to accomplish the data encoding/compression. When the VLC algorithm is applied, at 416, the compression output is in the form of a VLC bitstream. Whether the VLC algorithm (416) or the hash table algorithm (420) is used to accomplish the data encoding/compression, the compressed data segment is output to a multiplexer to multiplex, at 422, to generate a hybrid hash table/VLC bitstream. As shown in FIG. 4 and the foregoing description, two paths, within process 400, can result in using the VLC algorithm. In other words, the CODEC attempts to use its innate hash table encoder for selectable length segments of the input data. If the criteria for the hash table encoding algorithm are not met, however, the VLC algorithm is applied.

VLC Encoder

Figure 5:
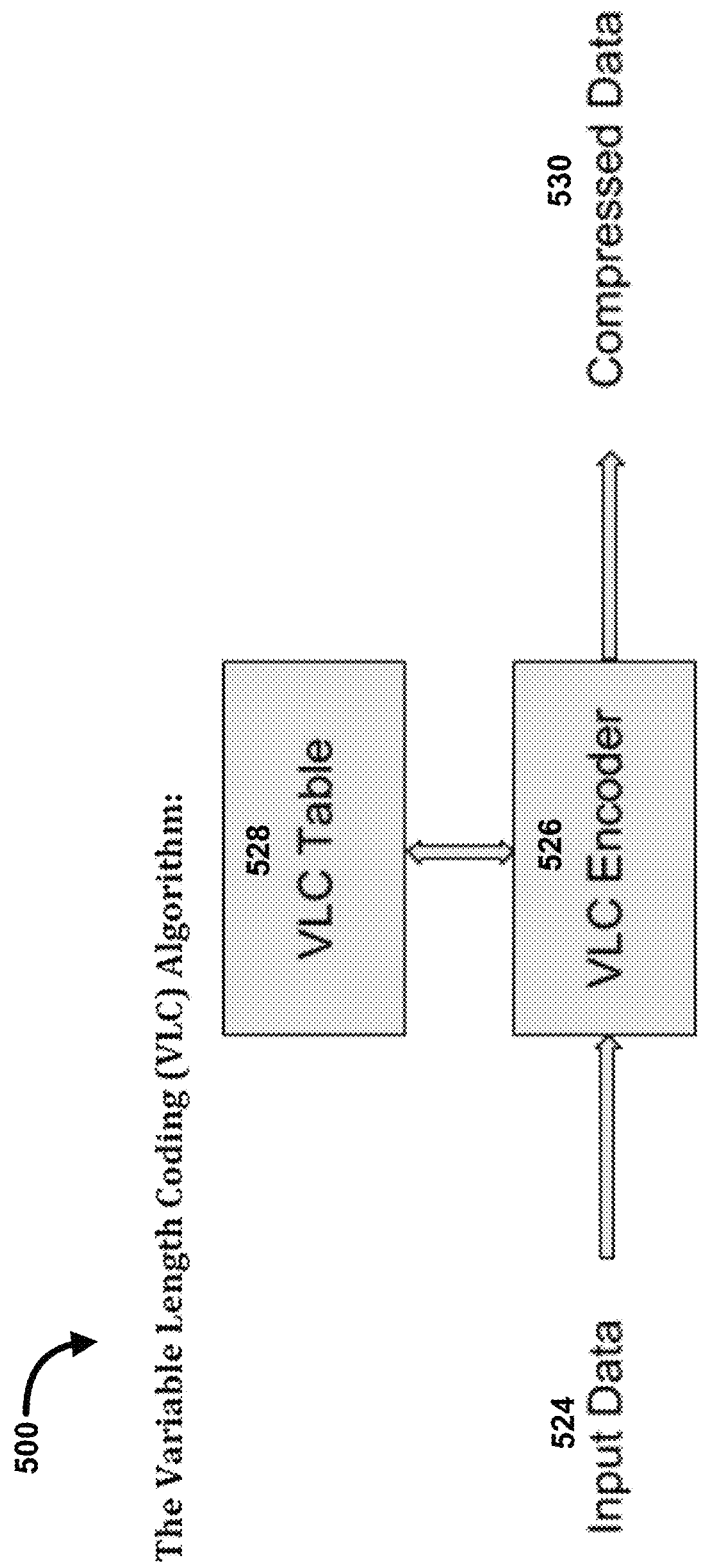
FIG. 5 is a flow diagram illustrating a variable length encoder (VLC) encoder dataflow, according to some embodiments.

FIG. 5 is a flow diagram illustrating a VLC encoder dataflow (compatible, for example, with step 416 in FIG. 4), according to some embodiments. As shown in FIG. 5, the VLC dataflow 500 is implemented using a VLC encoder 526, which receives an input data stream 524 (including bytes of data), and which communicates with a VLC table 528 of a dictionary to encode the input data and generate compressed data 530. During encoding, the VLC encoder 525 looks each byte up in the VLC table 528 and outputs the codeword for the byte. If the byte is not already in the VLC table 528, the \TLC encoder 526 adds the byte to the VLC table 528. The VLC encoder 526 assigns short codewords to frequently occurring segments and longer codewords to less frequently occurring segments. As such, the order of occurrence of the ASCII characters may be similar to that shown in the Huffman tree of FIG. 2. Although 8 bits can be used to represent each character, the encoder 526 can leverage the fact that "E" occurs much more frequently than "Z" by assigning, for example, only 3 bits 000 to the letter "E," and 7 bits: 1111111 to the letter "Z."

The VLC encoder 526 can define codewords for each byte to be encoded in accordance, for example, with a format defined by Table 1:

TABLE 1

| VLC Codeword Format | |
|---|---|
| Prefix Code | VLC |
| 2-6 bits | 2-8 bits |

The prefix code and the VLC, collectively, define the codeword. The prefix code can be used to identify how many bits are in the VLC:

TABLE 2

| Prefix Codes | |
|---|---|
| Prefix Code | VLC Length |
| 00 | 2 bits |
| 010 | 3 bits |
| 0110 | 4 bits |
| 01110 | 5 bits |

TABLE 2-continued

| Prefix Codes | |
|---|---|
| Prefix Code | VLC Length |
| 011110 | 8 bits |
| 011111 | Reserved |

Note that only the first bit is used for the last entry in the table. It is used to tell the decoder which algorithm is being used.

VLC Code Length

In some embodiments, a first predetermined number (e.g., 20) of VLCs are defined in a dictionary, an example excerpt of which is provided in Table 3 below:

TABLE 3

| VLC Dictionary | | |
|---|---|---|
| Prefix Code | VLC Code | Byte |
| 00 | 00 | E |
| 00 | 01 | T |
| 00 | 10 | A |
| 010 | 11 | O |
| 010 | 000 | N |
| 010 | 001 | R |
| 010 | 010 | I |
| 010 | 011 | H |
| 010 | 100 | S |
| 010 | 101 | D |
| 010 | 110 | L |
| 010 | 111 | C |
| 0110 | 0000 | U |
| 0110 | 0001 | M |
| | And so on . . . | |

As shown in Table 3, each of the Prefix Code and the VLC Code is associated with a byte being coded. The bytes listed in Table 3 match the bytes shown in the Huffman Table of FIG. 2. In some embodiments, the decoded bytes are stored in a buffer that is subsequently accessible by the VLC decoder, as discussed further below with reference to hash table encoding/decoding.

VLC Tables

In some embodiments, a pre-compiled VLC table can be used for encoding and/or decoding of data or data segments. Alternatively, instead of using a pre-compiled table, a table can be defined and populated by adding new bytes thereto as incoming bytes are processed. To maintain compression performance, the VLC encoder can dynamically update the table by shifting a table reference associated with the most recently encoded byte towards the top of the table (i.e., where codeword lengths are shorter). As shown in Tables 4-5 below, the "A" is coded (Table 4) and then moves up (or "bubbles" up) one row in the table (Table 5) by swapping the "A" with the "T" above it.

TABLE 5

| After Coding "A" | | |
|---|---|---|
| Prefix Code | VLC | Byte |
| 00 | 00 | E |
| 00 | 01 | A |
| 00 | 10 | T |
| 00 | 11 | O |
| 010 | 000 | N |

TABLE 4

Coding "A"

| Prefix Code | VLC | Byte |
|---|---|---|
| 00 | 00 | E |
| 00 | 01 | T |
| 00 | 10 | A |
| 00 | 11 | O |
| 010 | 000 | N |

In some embodiments, a VLC encoding process includes:
(1) Receive or retrieve a byte from the input
(2) Query a VLC table to detect whether the codeword for the byte is already stored in the table
(3) If the byte is found in the table:
  (a) Store in a memory file and/or transmit/send the codeword from the table;
  (c) Update the VLC table.
(4) If the byte is not found in the table:
  (a) Append the byte to the end of the table
  (b) Store in a memory file and/or transmit/send the codeword from the table; and
(5) Repeat steps (1)-(4)

VLC Decoder

Figure 6:
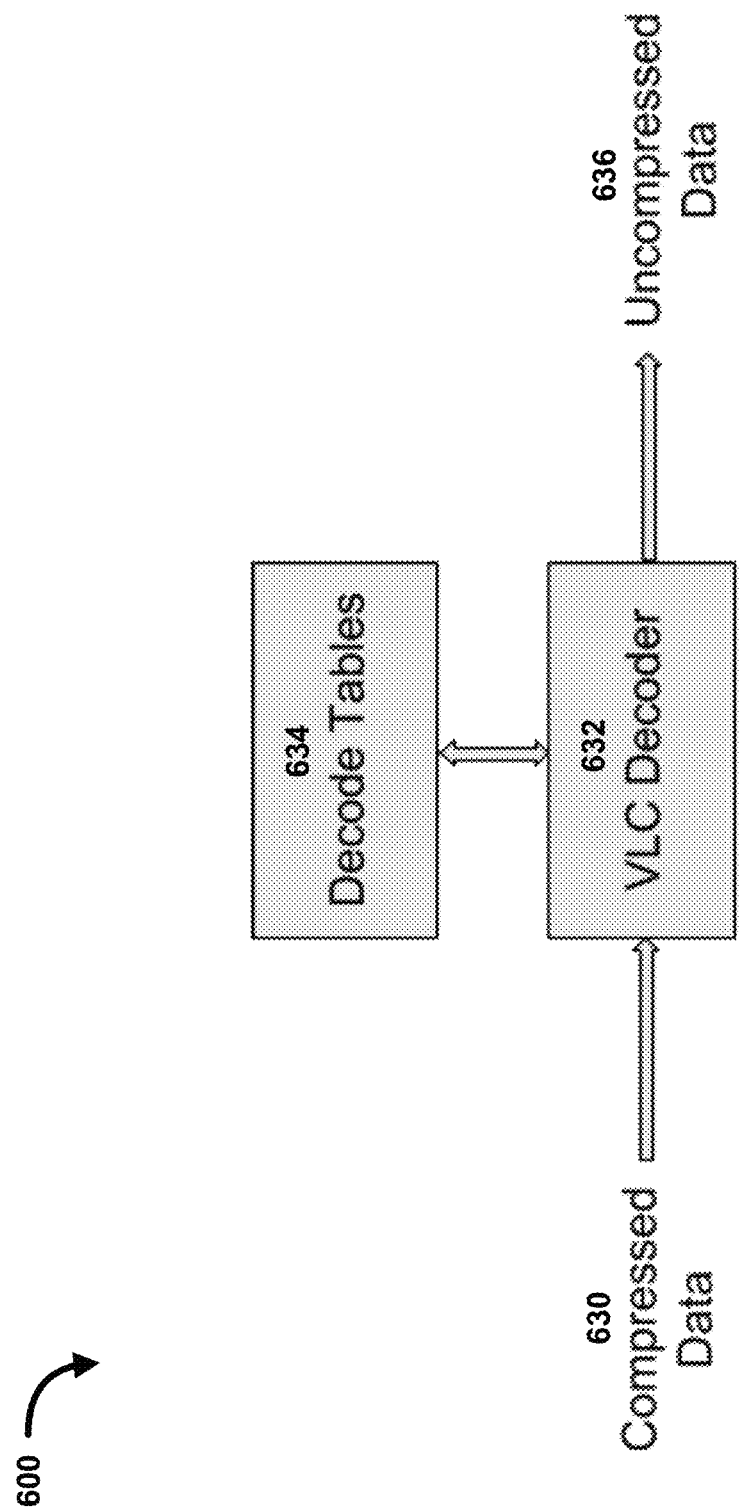
FIG. 6 is a flow diagram illustrating a VLC decoder dataflow, according to some embodiments.

An example VLC decoder dataflow, according to some embodiments, is provided in FIG. 6. As shown in FIG. 6, the VLC decoder dataflow 600 is implemented using a VLC decoder 632, which receives compressed data 630 (including bytes of data), and which communicates with one or more decode tables 634 to decode the compressed data 630, thereby generating uncompressed data 636. Recall from the VLC encoder description above (e.g., with reference to FIG. 5) that the VLC codeword can include a prefix code that varies in length, for example from 2 bits to 6 bits, and a VLC code that varies in length from 2 bits to 8 bits. During decoding, die VLC decoder 632 applies (or compares) the prefix code to a VLC lookup table (decode table(s) 634) (e.g., via a query referencing the prefix code) to identify the number of bits to be read from the input compressed data 630, to decode the bitstream. The identified number of bits are then read and applied (or compared) to the VLC lookup table from which the decoded byte is retrieved (e.g., via a query referencing the bits). In some implementations, to improve the compression ratio, the VLC encoder updates the VLC lookup table by swapping the encoded byte's position in the table with the entry above it. This may result in a shorter VLC codeword for the encoded byte, due to the variable size of the VLC codewords. To remain in sync with the VLC encoder, the VLC decoder 632 performs the same procedure. The output of the VLC decoder 632 is a stream of decoded bytes (uncompressed data 636) that correspond to the bytes originally input to the VLC encoder. In some embodiments, the VLC encoder also determines which table, from multiple pre-stored tables, best matches the input data, and the encoded bitstream (compressed data 630) correspondingly includes a header that specifies which of the multiple pre-stored tables the VLC decoder 632 should query during the decoding.

In some embodiments, a VLC decoding process includes:
(1) Select a decoder table specified in the header of the bitstream
(2) Receive or retrieve a prefix code from the input
(3) Detect, based on the prefix code, a number of bits to read
(4) Read the bits associated with the detected number of bits
(5) Query the VLC lookup table based on the bits
(6) Retrieve the decoded byte
(7) Save/store and/or transmit the decoded byte
(8) Update the VLC lookup table
(9) Repeat steps (1)-(9)

Hash Table Algorithm

Figure 7:
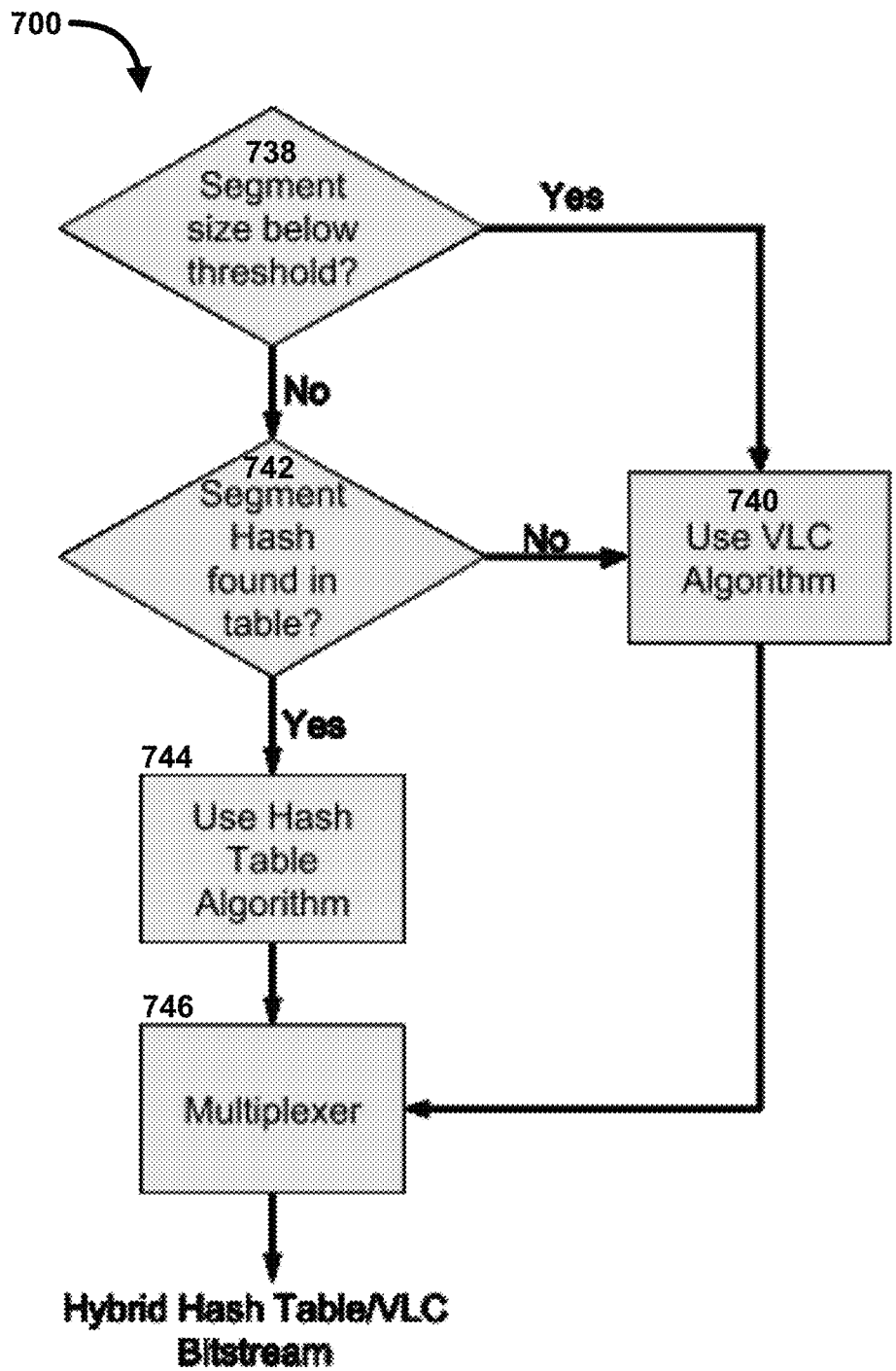
FIG. 7 is a flow diagram illustrating a hybrid coder-decoder, according to some embodiments.

In some embodiments, a hash table algorithm performs compression by replacing long sequences of bytes with a hash value, where each hash value is shorter than the length of the associated byte sequence. The hash table forms part of the overall hybrid CODEC, in that the hash table is selectively used when (1) the length of the byte sequence to be encoded is above a preselected value, and (2) the hash is found in a hash table dictionary. When conditions (1) and (2) are not met, the VLC encoding described above (e.g., with reference to FIG. 5) is applied. FIG. 7 is a flow diagram illustrating a hybrid CODEC process, according to some embodiments. As shown in FIG. 7, the hybrid CODEC process 700 begins with a determination, at 738, of whether an incoming binary data segment has a size (e.g., length) that is below a predetermined or predefined (e.g., configurable) threshold size. If the binary data segment size is below the threshold, the CODEC process 700 uses the VLC algorithm, at 740, to encode the binary data segment. If the binary data segment size is not below the threshold (i.e., is at or above the threshold), the CODEC process 700 proceeds to query a hash table to determine, at 742, whether a hash of the binary data segment is already present/stored in the hash table. Optionally, the hybrid encoder generates the hash of the binary data segment prior to 742, and subsequent to or concurrently with 738. If the hash of the binary data segment is not found in the hash table, the CODEC process 700 proceeds to use the VLC algorithm, at 740, to encode the first byte of the binary data segment. Alternatively, if the hash of the binary data segment is found in the hash table, the CODEC process 700 proceeds to employ the hash table algorithm 744 to encode the binary data segment. Whether the binary data segment is encoded using the VLC algorithm at 740 or using the hash table algorithm at 744, the encoded bits are input to a multiplexer 746, which outputs a hybrid hash table/VLC bitstream.

Figure 8:
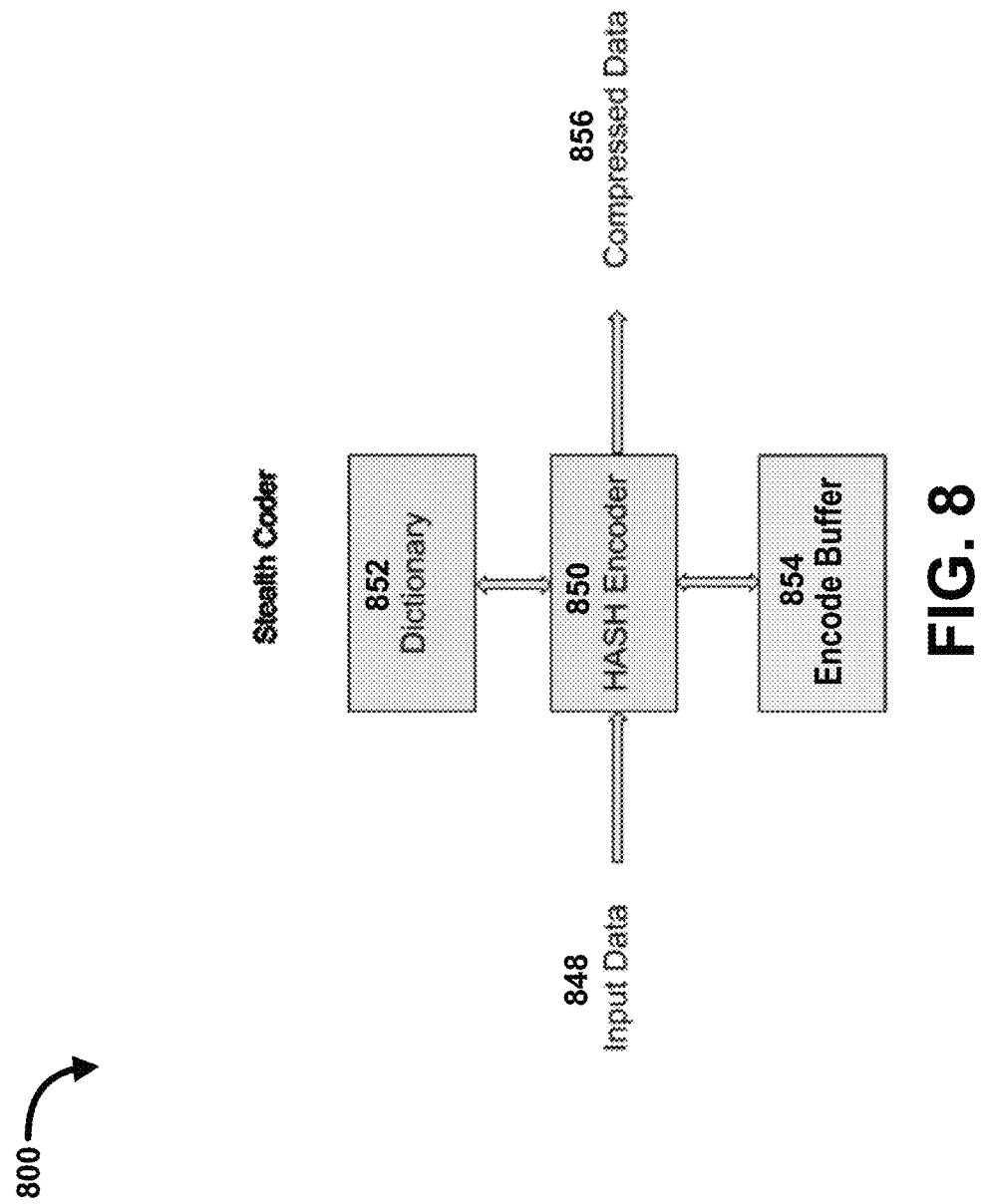
FIG. 8 is a flow diagram illustrating a hash encoder, according to some embodiments.

FIG. 8 is a flow diagram illustrating a hash encoder (configurable, for example, to execute the hash algorithm referenced at 744 of FIG. 7), according to some embodiments. As shown in FIG. 8, a stream of bytes (input data 848) is transmitted to, and received at, the hash encoder 850. The hash encoder 850 (or "hash table encoder") "grabs" (extracts/isolates) N bytes (Note: N is equal to four in this embodiment, but could be more or less than N), generates a hash value for the N bytes, the hash value corresponding to the offset of the N bytes in the decode buffer, and queries the dictionary 852 based on the hash value to determine whether the hash for the N bytes is already stored in the dictionary 852. If the hash is not found, an integrated VLC encoder (e.g., VLC encoder 526 of FIG. 5) can be invoked to encode the first byte of the N bytes. The codeword from the VIE encoder can then be multiplexed with hash table codewords to produce a hybrid hash table/VLC bitstream (compressed data 856) as an output. If the hash value is found in the dictionary 852, the encoder locates the N bytes in the decode buffer using the offset indicated by the hash value. The encoder then checks to see if any more of the incoming bytes match those adjacent to the N bytes in the decode buffer. If not, the encoder inserts the hash value, along with N, in a new codeword in accordance, for example, with the format defined by Table 6 where N is equal to 4. The N bytes are also appended to the decode buffer. If the hash value is not found, the encoder scans the data stored in the decode buffer for a possible match elsewhere in the buffer. If found, the encoder checks for more matching adjacent bytes and then generates a new hash value for the selected bytes. The hash value is then encoded and stored in a new codeword along with the length: N The selected bytes are also stored in the decode buffer.

TABLE 6

Hash Encoder Codeword Format

| Prefix Code | Length | Hash Value |
|---|---|---|
| 1 bit | 4 bits | 16 bits |

Hash Codeword

As shown in Table 6, the first bit of the codeword indicates that the hash table algorithm is being used for this codeword. The next 4 bits of the codeword indicate the length of the segment being compressed. When a segment to be encoded meets the criteria described earlier, a 16 bit hash value is generated using the segment to be encoded. An example hash function is as follows:

$$hash = (U16)(((src) * HASH32) >> 16) \text{ where}$$

$$HASH32 = 2654435761 \text{ (Prime number) and}$$

$$src = 4 \text{ bytes to be encoded}$$

In some embodiments, the hash becomes the key for the hash table (e.g., pre-set hash table 112D of FIG. 1A). The value retrieved from the hash table is the offset of the original data segment from the beginning of the decoder buffer. The original data segment is stored at this offset location.

Optimizing the Hash Code Word

Similar to the VLC encoder, the hash table matches occur in a pattern, with some more frequently than others. Greater compression ratios can be achieved by assigning smaller hash values to the more frequently-occurring matches, and by assigning larger hash values to the less frequently-occurring matches.

In some embodiments, the use of weighted frequencies in the hash table encoder yields a codeword having the format defined by Table 7.

TABLE 7

Hash Encoder Weighted Codeword Format

| Prefix Code | Length | Hash Length | Hash Value |
|---|---|---|---|
| 1 bit | 4 bits | 4 bits | 1-15 bits |

The weighted format of Table 7 results in codeword lengths varying between 10 and 24 bits, as opposed to 21 bits with the unweighted format of Table 6. Since the most frequently-occurring hash values are the smaller ones, the overall compression ratio increases.

Extending the Length Range Beyond 15

When the length of a codeword is 4 bits (e.g., as shown in Table 7 above), one might expect the range to be 1 to 15. Since the minimum match size is 4 bytes, however, the hash encoder uses the range shown in Table 8 below:

TABLE 8

Hash Encoder Length Table
Length Table Using 4 as minimum match

| Binary | Decimal |
|---|---|
| 0000 | 4 |
| 0001 | 5 |
| 0010 | 6 |
| " | " |
| " | " |
| 1011 | 15 |
| 1100 | 16 |
| 1101 | 17 |
| 1110 | 18 |
| 1111 | Begin tallying bits |

As shown in Table 8 above, to extend the length range beyond 18 bits, the last 4 bits are reserved to indicate the use of tallying. The range for this nibble is 1 to 14, with 1111 indicating an instruction to begin reading individual bits, with each 1 representing an extra 14 bits, and a 0 indicating the end of tallying. An example is provided in Table 9 below.

TABLE 9

Hash Encoder Length Determination

| Binary | Tally (1 = 14) | Tally End | Binary | Total |
|---|---|---|---|---|
| 1 1 1 1 1 | 1 1 1 1 1 1 | 0 | 0 1 0 0 | Length |
| 18 | 14 14 14 14 14 14 14 | 0 | 4 | 120 |

Figure 9:
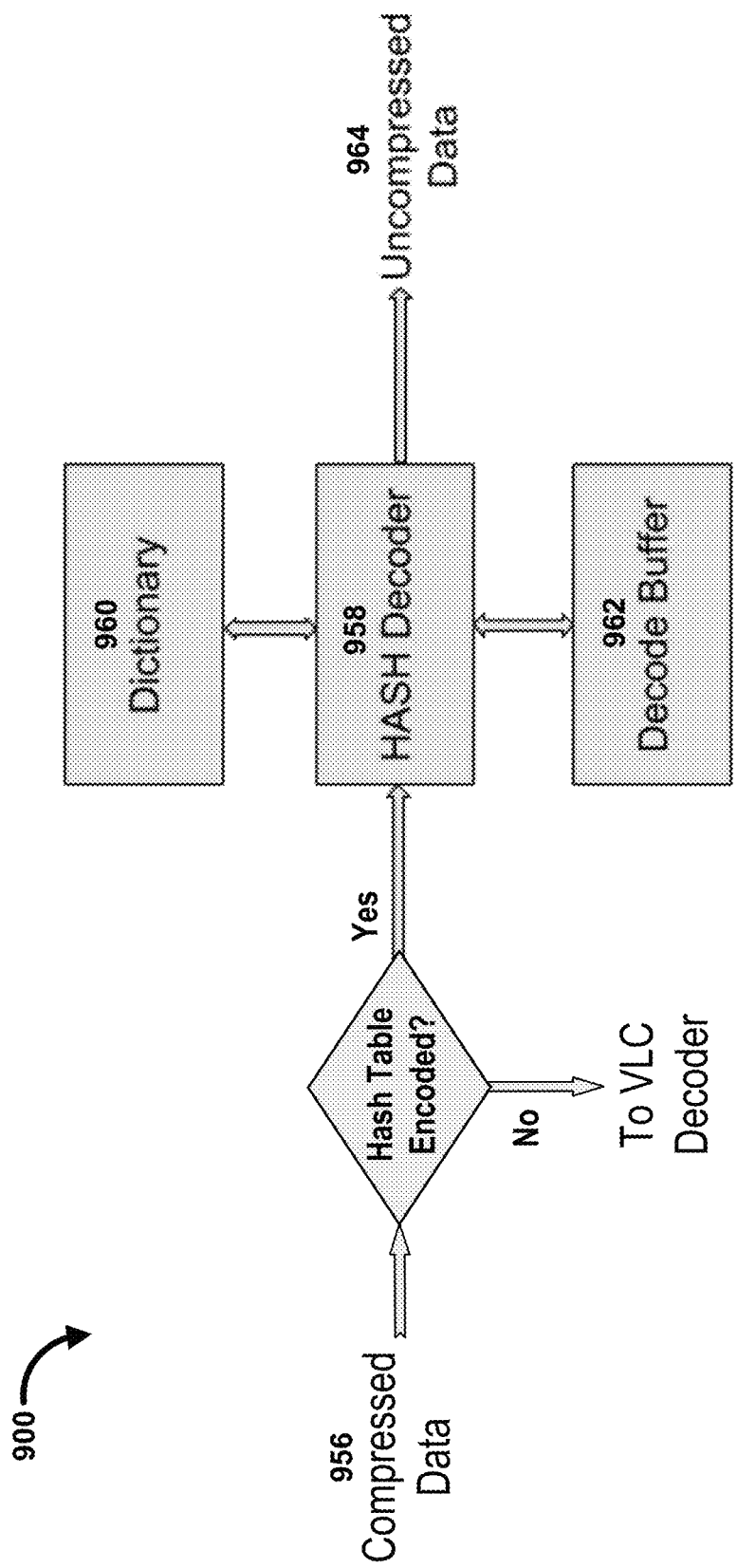
FIG. 9 is a flow diagram illustrating a hash decoder, according to some embodiments.

In some embodiments, a hash encoding process includes:
(1) Receive or retrieve four bytes from the input
(2) Generate a hash value based on the 4 bytes
(3) Query the hash table based on the hash value
(4) If the hash value is returned/found:
 (a) Check for more matching bytes beyond the initial four bytes
 (b) If more matching bytes are found:
  (i) Increase the length by the number of new matching bytes: N
  (ii) Append the four+N bytes to the decode buffer
  (iii) Update the offset for the hash key, and overwrite the offset in the hash table
  (iv) Save/store and/or transmit the codeword with the updated length
 (c) If more matching bytes are not found:
  (i) Append the 4 bytes to the decode buffer
  (ii) Update the offset for the hash key, and overwrite the offset in the hash table
  (iv) Save/store and/or transmit the codeword
(5) If the hash value is not returned/found:
 (a) Encode the first byte of the four bytes using the VLC method
 (b) Append the byte to the decode buffer Hash Table Decoder Algorithm A flow diagram illustrating a hash decoder, according to some embodiments, is provided in FIG. 9. As shown in FIG. 9, the hash decoder 958 determines/detects from the first bit of the received compressed data 956 whether the compressed data 956 is a hash table encoded bitstream. If the bit is equal to 1, this indicates that the compressed data 956 bitstream contains hash table encoded bits. If the bit is not equal to 1, this indicates that the bitstream contains VLC-encoded bits, and the compressed data 956 bitstream is passed to the VLC decoder.

The hash decoder 958 reads and saves the next 4 bits of the compressed data 956. These 4 bits represent the length of the data segment to be decoded. Another 4 bits are then read, these further 4 bits representing the length of the hash value. Finally, based on the value of the previous 4 bits, a number of bits (between 1 and 15) associated with the length of the hash value are read. These 1-15 bits represent the hash value that points to the offset of the data segment to be extracted from the decoder buffer. Note that, in most embodiments, both the VLC decoder and the hash decoder append/add a copy of the decoded byte(s) to their respective/associated decoder buffers. The hash key can then be applied to a hash table (e.g., dictionary 960). The value obtained from dictionary 960 is the offset into the decode buffer 962 which, along with the previously decoded length, is used to locate the indicated bytes from the decode buffer 962 and output them (e.g., transmitting and/or saving the decoded data).

In some embodiments, a hash table decoding process includes:
(1) Receive compressed data
(2) Determine, based on a first bit of the compressed data, whether the bitstream is hash table encoded or VLC encoded
(3) If the bitstream is not hash table encoded
  (a) Pass the bitstream to a VLC decoder
(4) If the bitstream is hash table encoded
  (a) Read and save the next 4 bits, which represent the length of the to-be-decoded data segment
  (b) Read another 4 bits, which represent the hash key size
  (c) Read another 1-15 bits, depending upon the hash key size, and query the hash table based on the 1-15 further bits
  (d) In response to the query, receive the offset value
  (e) Locate, within the decoder buffer and based on the offset value and the length, the decoded data segment
  (e.g., (f) Output (e.g., save/store and/or transmit) the decoded data segment Dynamic Dictionary Update
Dynamically Selected Precompiled Dictionaries In some embodiments, to achieve high compression ratios on small files (which can be characteristically more difficult to compress), encoders of the present disclosure can make use of pre-compiled dictionaries/VLC tables. These pre-compiled dictionaries/VLC are tailored to specific file/data types. The dictionary to be used for any given action may be specified at run-time, or may be selected real-time or near-real-time by analyzing a "small" (e.g., ~4 kilobytes (kB)) portion of the file to be processed. In addition, the dictionary may be selected by an Artificial Intelligence (AI) powered dictionary selector algorithm. Note that, in some instances, a pre-compiled dictionary serves as a starting point dictionary that will subsequently be updated as described herein.

Figure 10:
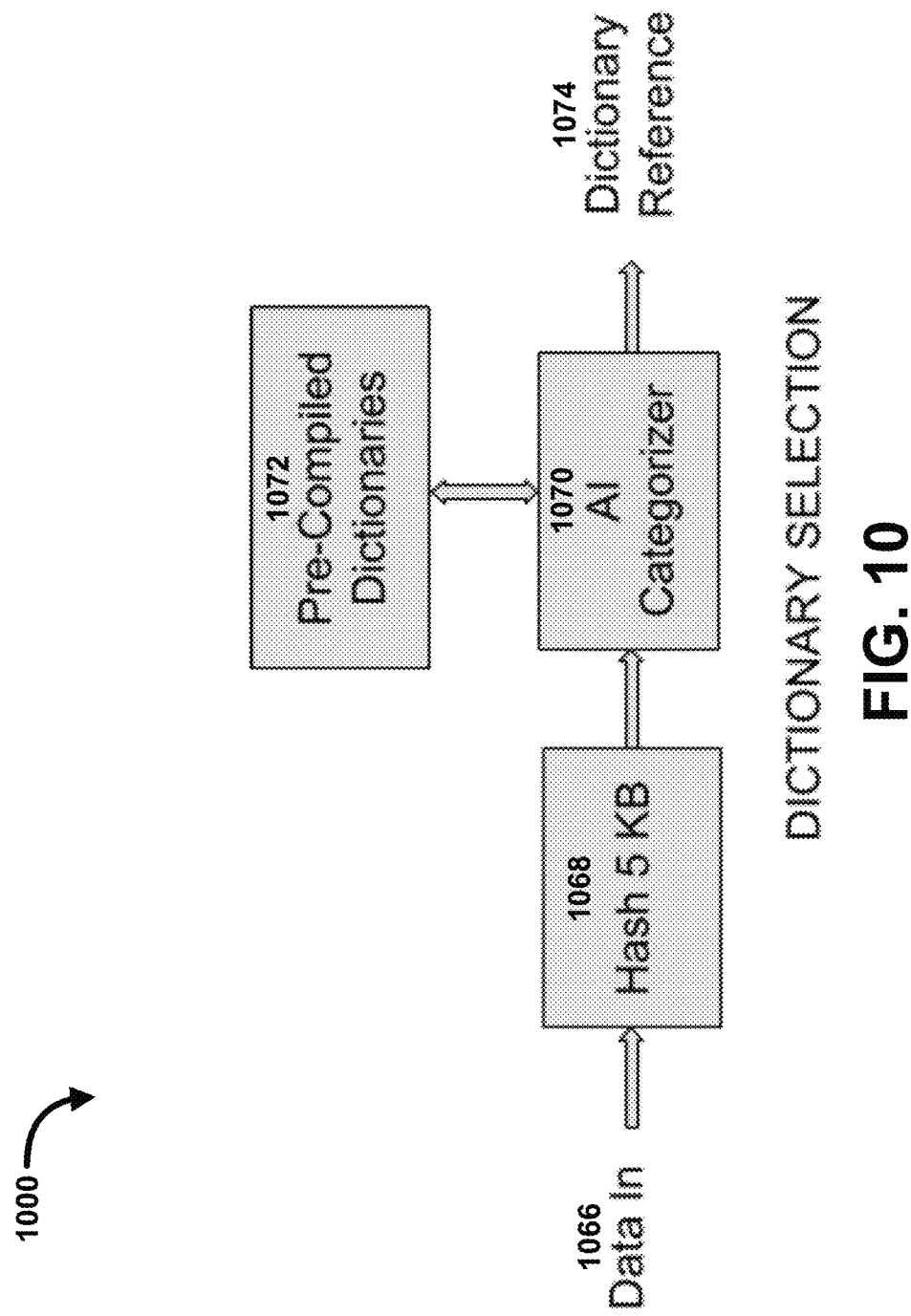
FIG. 10 is a flow diagram illustrating a dictionary selection process, according to some embodiments.

FIG. 10 is a flow diagram illustrating a dictionary selection process, according to some embodiments. As shown in FIG. 10, an incoming data stream (labelled as "Data In") 1066 has its first 5 kB hashed at 1068. An AI categorizer 1070 can compare the 5 kB hash to multiple pre-compiled dictionaries 1072 to identify an appropriate dictionary associated with the given hash. The AI categorizer 1070 then outputs the selected dictionary, as dictionary reference 1074.

Example Hybrid Encoding Process:
An example of a portion of an input bitstream segment is given below:

| A B C D | E F A B | C D E G | A B C D |
|---------|---------|---------|---------|

1) ABCD not in hash table. Code A using VLC. Store A in the decode buffer.
2) BCDE not in hash table. Code B using VLC. Store B in the decode buffer.
3) CDEF not in hash table. Code C using VLC. Store C in the decode buffer.
4) DEFA not in hash table. Code D using VLC. Store D in the decode buffer.
5) EFAB not in hash table. Code E using VLC. Store E in the decode buffer.
6) FABC not in hash table. Code F using VLC. Store F in the decode buffer.
7) ABCD found in hash table. In addition the next character, E is found in the input. Code ABCDE using the hash table encoder. Store ABCDE in the decode buffer.
8) GABC not in hash table. Code G using VLC. Store G in the decode buffer.
9) ABCD found in hash table. Code ABCD using the hash table encoder. Note that this involves overwriting the hash for ABCD already in the hash table with the new offset. Store ABCD in the decode buffer.

Figure 11:
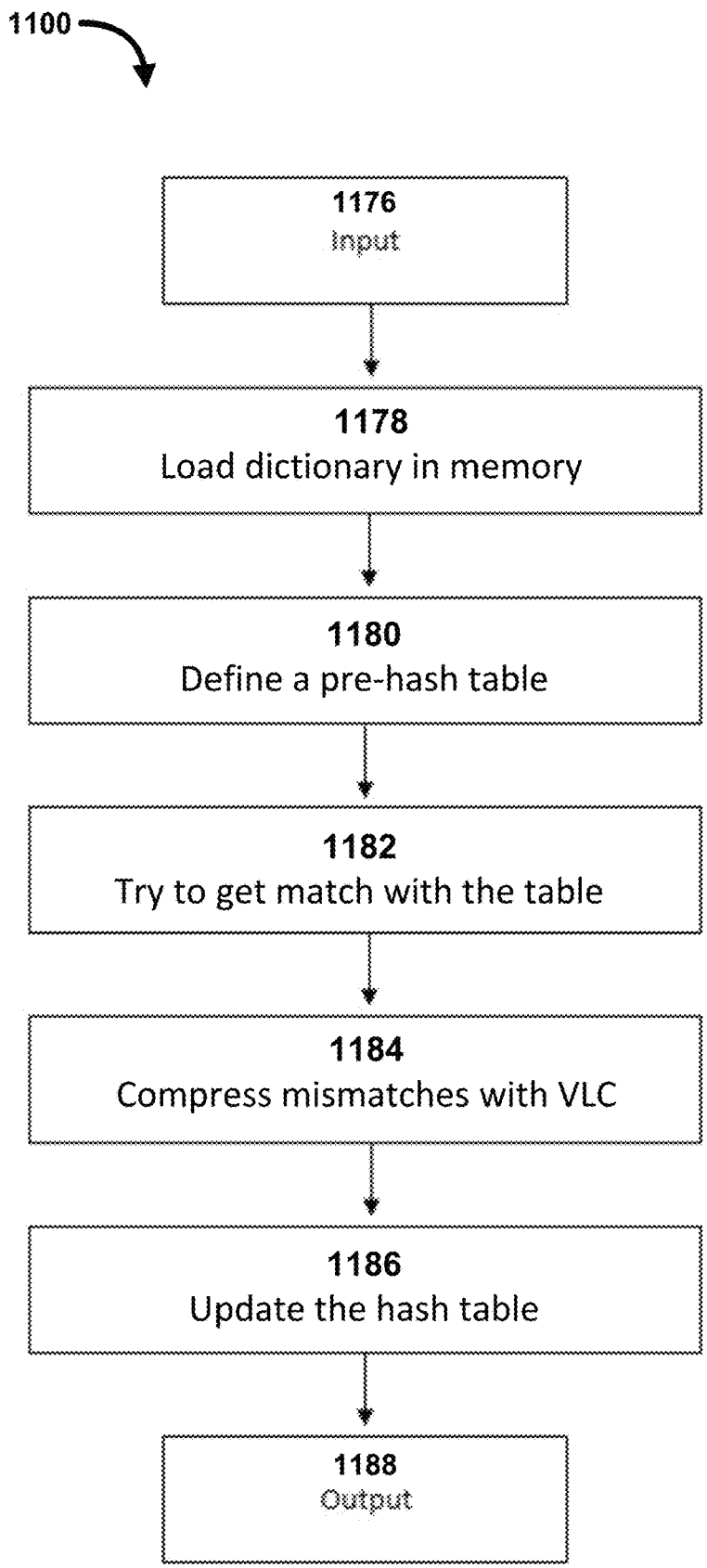
FIG. 11 is a flow diagram illustrating a compression process, according to some embodiments.

FIG. 11 is a flow diagram illustrating a compression process, according to some embodiments. As shown in FIG. 11, the compression process 1100 includes receiving input (e.g., uncompressed, binary) data at 1176, loading a dictionary into memory at 1178, and defining a pre-hash table at 1180. An attempt to match the input data with the pre-hash table is performed at 1182, and any portions or segments of the input data that cannot be matched to the pre-hash table (i.e., "mismatches") are compressed using a VLC (at 1184). The hash table is then updated, at 1186, and the resulting output 1188 is transmitted and/or stored.

Figure 12:
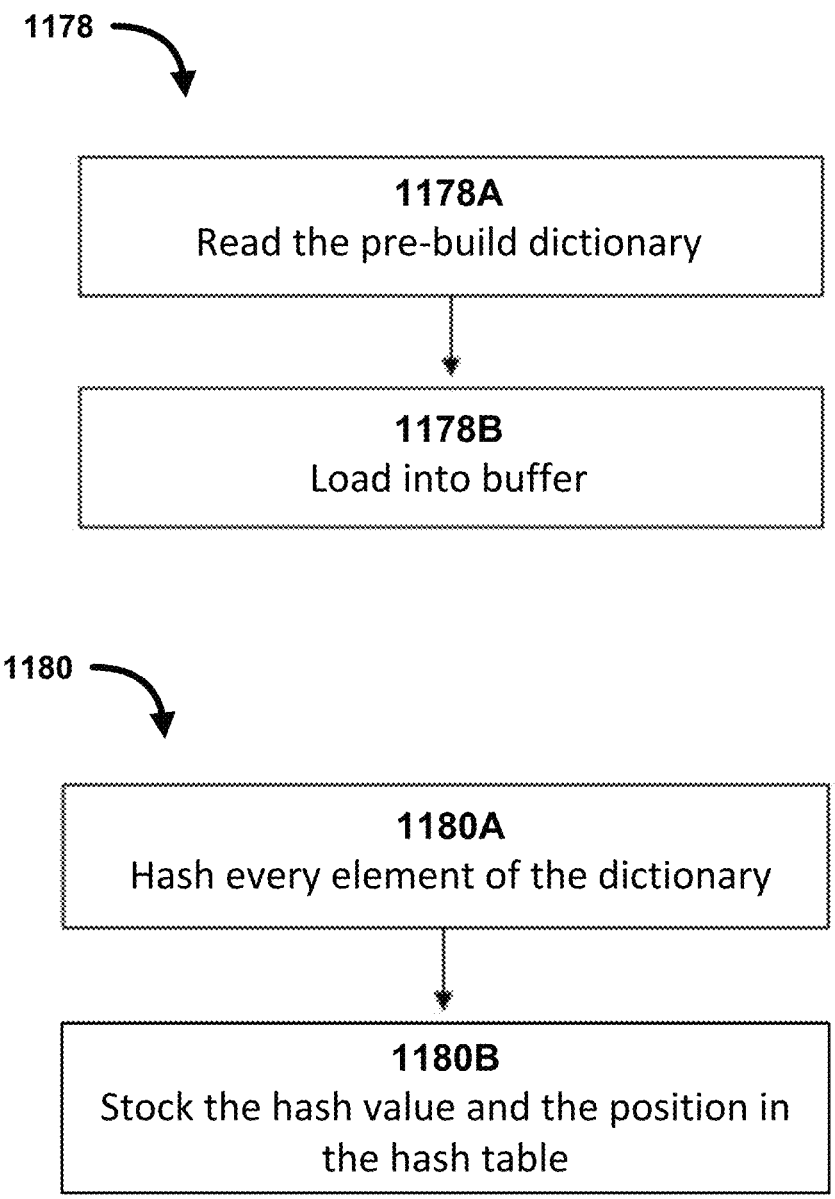
FIG. 12 is a flow diagram illustrating details of the "load dictionary" and "define pre-hash table" steps of FIG. 11.

FIG. 12 is a flow diagram illustrating details of the "load dictionary" 1178 and "define pre-hash table" 1180 steps of FIG. 11. As shown in FIG. 12, the "load dictionary" 1178 action includes reading a pre-build (or "precompiled," as described above) dictionary at 1178A and loading the relevant portions of the pre-build dictionary into a buffer at 1178B. The "define pre-hash table" 1180 action includes hashing every element of the pre-build dictionary, at 1180A, and stocking (or storing) each hash value and its associated position in the hash table at 1180B.

Figure 13:
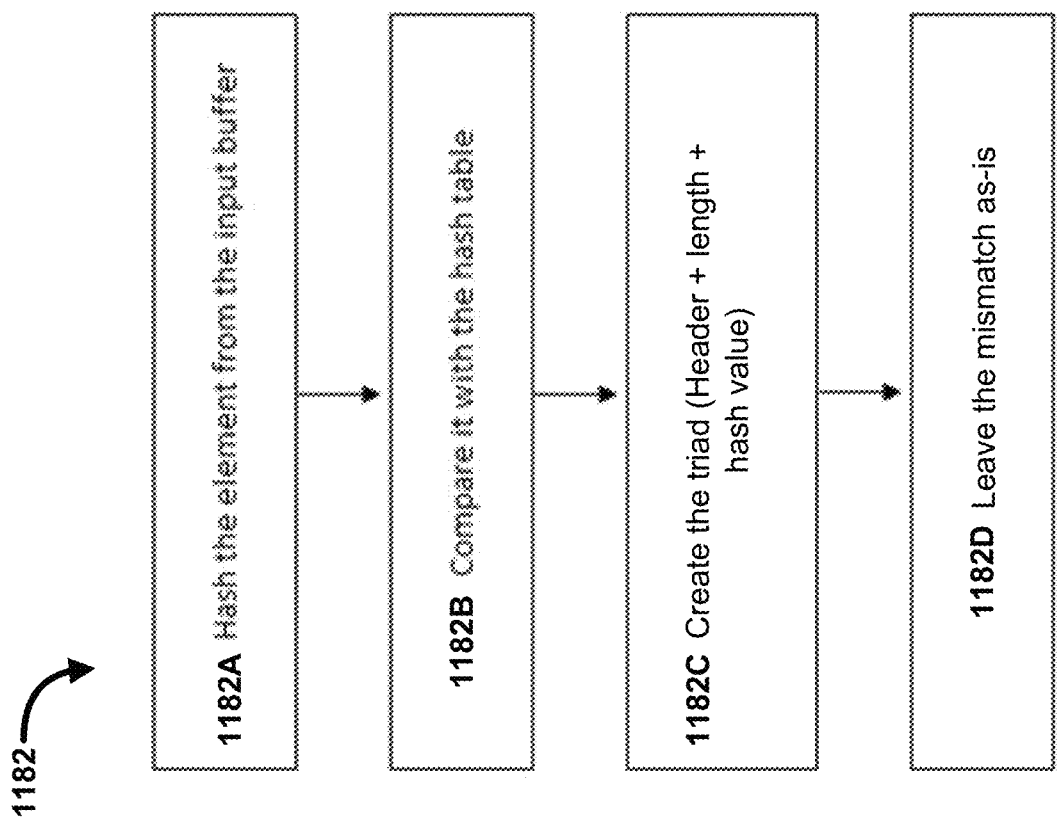
FIG. 13 is a flow diagram illustrating details of the "table matching" step of FIG. 11.

FIG. 13 is a flow diagram illustrating details of the "table matching" step 1182 of FIG. 11. As shown in FIG. 13, the "table matching" 1182 action includes hashing an element (e.g., a data segment) from the input buffer at 1182A to form a hash, comparing the hash with the hash table at 1182B (e.g., by querying the hash table with a reference to the hash). Defining a triad (header+length+hash value) at 1182C for all matched values, and not defining triads for any mismatched hashes (i.e., leaving the mismatch "as-is"— 1182D).

Figure 14:
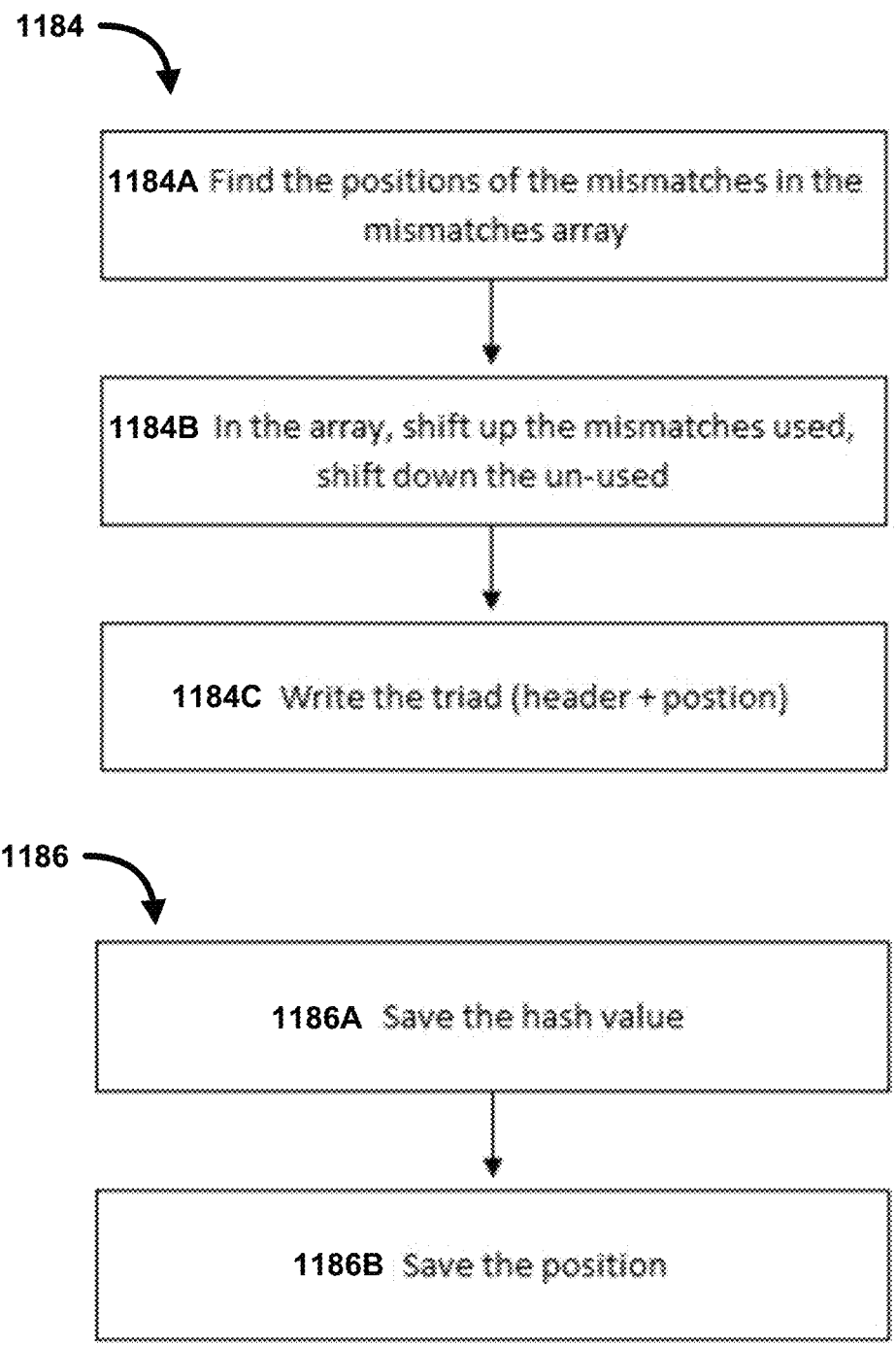
FIG. 14 is a flow diagram illustrating details of the "mismatch compression" and "hash table update" steps of FIG. 11.

FIG. 14 is a flow diagram illustrating details of the "mismatch compression" 1184 and "hash table update" 1186 steps of FIG. 11. As shown in FIG. 14, the "mismatch compression" 1184 includes locating, at 1184A, the positions of mismatches in the VLC table (also referred to herein as a "mismatches array"). In the array, at 1184B, used mismatches (i.e., hashes that were successfully compressed via the VLC) are shifted up and unused mismatches are shifted down. The triad (header+position) is written at 1184C. As also shown in FIG. 14, the "hash table update" 1186 action includes saving the hash value at 1186A, and saving the position data at 1186B.

Figure 15:
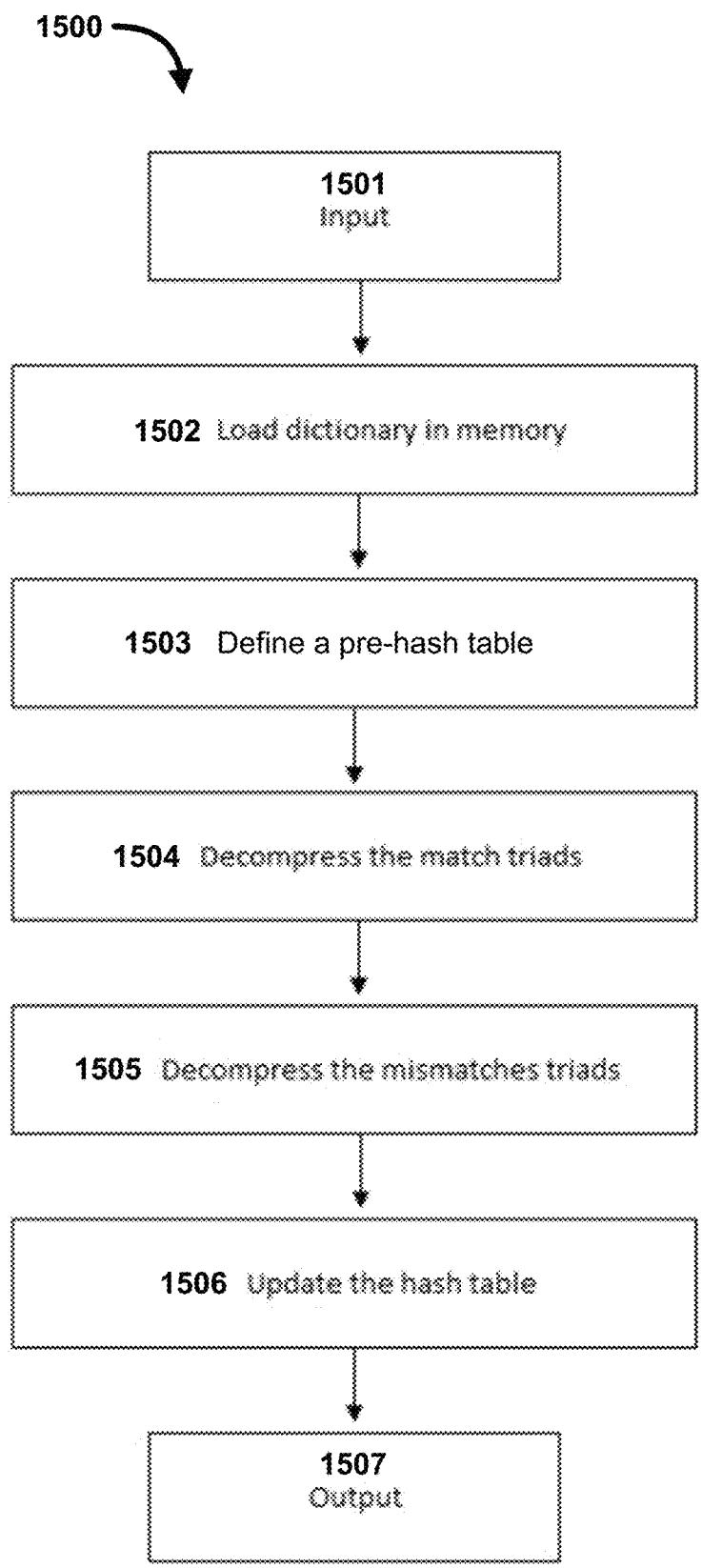
FIG. 15 is a flow diagram illustrating a decompression process, according to some embodiments.

FIG. 15 is a flow diagram illustrating a decompression process, according to some embodiments. As shown in FIG. 15, the decompression process 1500 includes receiving input (e.g., compressed) data at 1501, loading a dictionary into memory at 1502, and defining a pre-hash table 1503. An attempt to match the input data with the pre-hash table is performed, and matched triads are decompressed at 1504, while mismatched (i.e., unmatched) triads are decompressed at 1505. The hash table is then updated, at 1506, and the resulting output 1507 is transmitted and/or stored.

Figure 16:
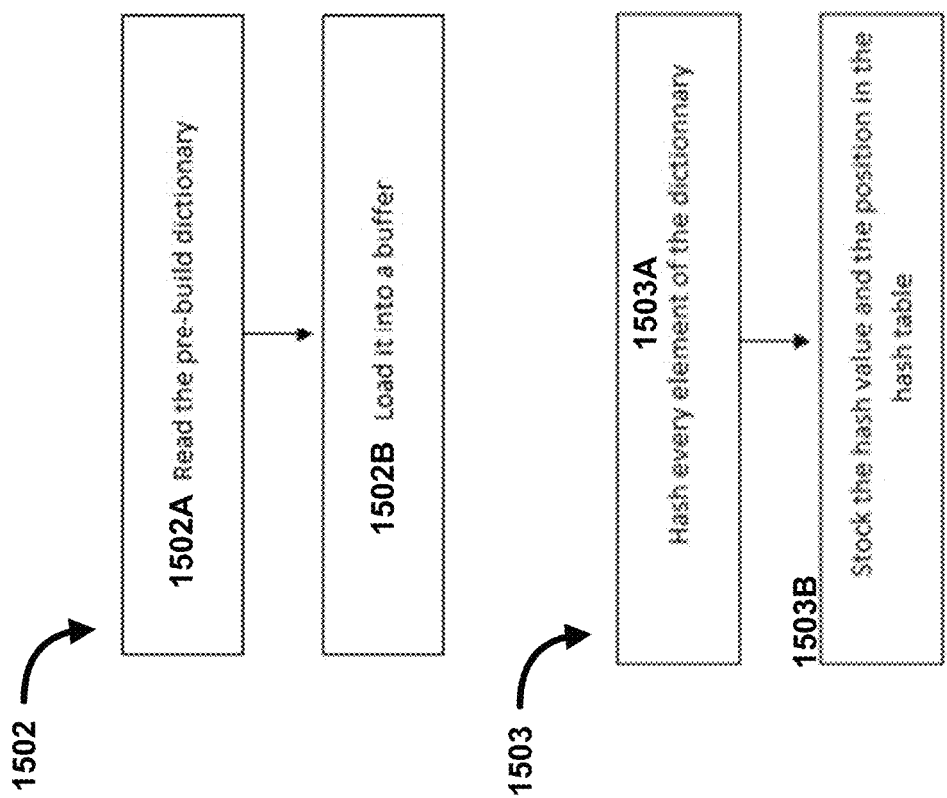
FIG. 16 is a flow diagram illustrating details of the "load dictionary" and "define pre-hash table" steps of FIG. 15.

FIG. 16 is a flow diagram illustrating details of the "load dictionary" 1502 and "define pre-hash table" 1503 steps of FIG. 15. As shown in FIG. 16, the "load dictionary" 1502 action includes reading a pre-built dictionary at 1502A, and loading the pre-built dictionary into a buffer at 1502B. The "define pre-hash table" 1503 action includes hashing every element of the pre-built dictionary at 1503A, and stocking/storing the hash value and position data in the hash table at 1503B.

Figure 17:
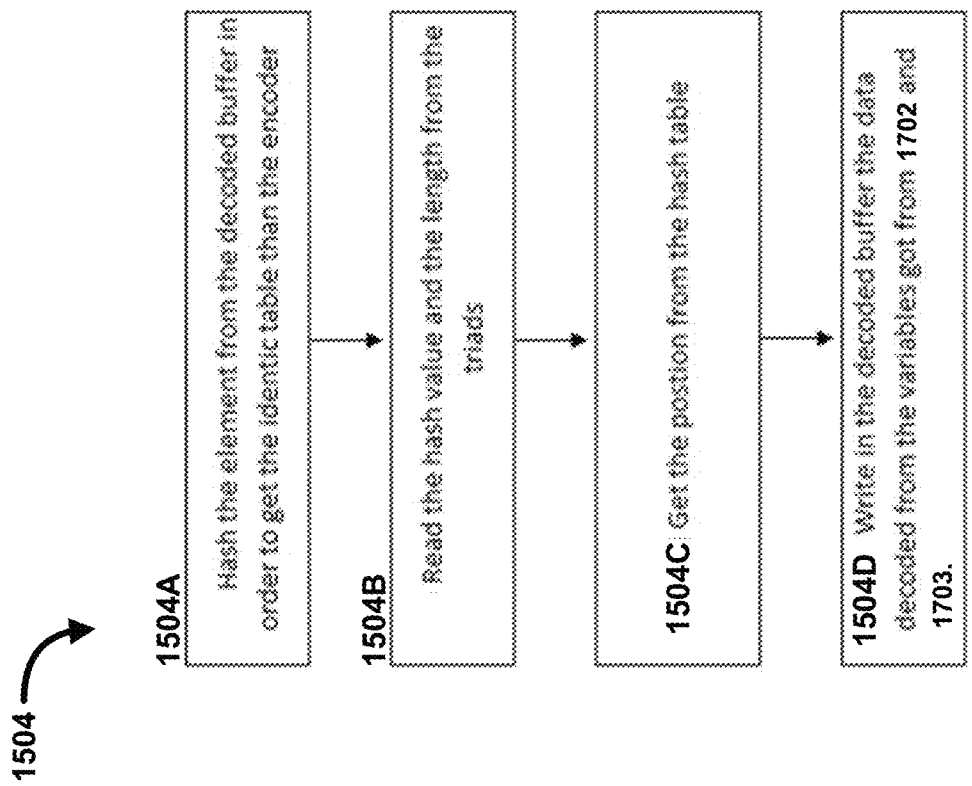
FIG. 17 is a flow diagram illustrating details of the "decompress match triads" step of FIG. 15.

FIG. 17 is a flow diagram illustrating details of the "decompress match triads" 1504 step of FIG. 15. As shown in FIG. 17, the "decompress match triads" 1504 action includes hashing the element from the decoder buffer to obtain the positions and update the hash table at 1504A. At 1504B, the hash value and the length are read from the triads. The position data is obtained at 1504C, and the data decoded based on the hash value, length, and position data obtained at 1504B and 1504C is written in the decode buffer (1504D).

Figure 18:
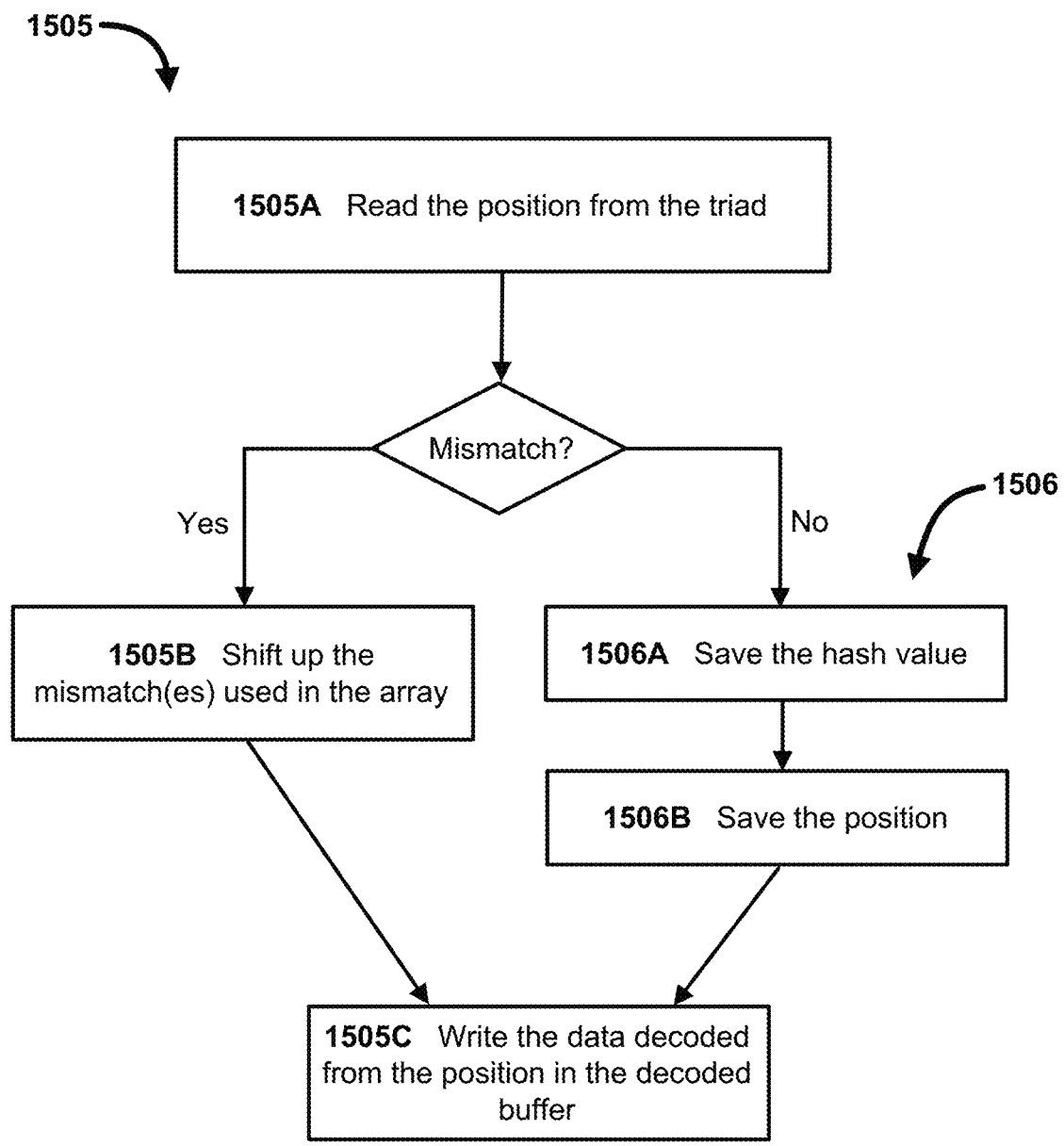
FIG. 18 is a flow diagram illustrating details of the "decompress mismatch triads" and "update hash table" steps of FIG. 15.

FIG. 18 is a flow diagram illustrating details of the "decompress mismatch triads" 1505 and "update hash table" 1506 steps of FIG. 15. As shown in FIG. 18, the "decompress mismatch triads" 1505 action includes reading position data from the triad at 1505A, if a mismatch is detected (branch "Yes"), and shifting-up the mismatch used in the mismatch array (1505B). Data decoded based on the position data is then written in the decoded buffer, at 1505C. If no mismatch is detected (i.e., if a "match" is found, branch "No"), the "update hash table" 1506 action includes updating the hash table with the new position by saving the hash value at 1506A, and saving the position data, at 1506B. In either case (i.e., whether there is or is not a mismatch), the decoded data is then written in the decoded buffer, at 1505C.

In some embodiments, a system includes a non-transitory memory, a processor, a DAC and a transmitter. The memory stores a predetermined file size threshold, a VLC encoder, and a hash table. The processor is in operable communication with the non-transitory memory, and configured to receive, at a processor, a first data, and to select one of the VLC encoder or the hash table based on a size of the first data. The processor is also configured to transform, using the selected one of the VLC encoder or the hash table, the first data into a second data including a compressed version of the first data. The DAC is configured to receive a digital representation of the second data from the processor and convert the digital representation of the second data into an analog representation of the second data. The transmitter is configured to transmit the analog representation of the second data. The transmitter can include an antenna such that the analog representation of the second data can be transmitted wirelessly. Alternatively or in addition, the transmitter can include a coaxial cable such that the analog representation of the second data can be transmitted over wire. Alternatively or in addition, the transmitter can include an optical fiber, such that the analog representation of the second data can be transmitted optically. The processor can be configured to store the digital representation of the second data in the memory.

All combinations of the foregoing concepts and additional concepts discussed here (provided such concepts are not mutually inconsistent) are contemplated as being part of the subject matter disclosed herein. The terminology explicitly employed herein that also may appear in any disclosure incorporated by reference should be accorded a meaning most consistent with the particular concepts disclosed herein.

The skilled artisan will understand that the drawings primarily are for illustrative purposes, and are not intended to limit the scope of the subject matter described herein. The drawings are not necessarily to scale; in some instances, various aspects of the subject matter disclosed herein may be shown exaggerated or enlarged in the drawings to facilitate an understanding of different features. In the drawings, like reference characters generally refer to like features (e.g., functionally similar and/or structurally similar elements).

To address various issues and advance the art, the entirety of this application (including the Cover Page, Title, Headings, Background, Summary, Brief Description of the Drawings, Detailed Description, Embodiments, Abstract, Figures, Appendices, and otherwise) shows, by way of illustration, various embodiments in which the embodiments may be practiced. The advantages and features of the application are of a representative sample of embodiments only, and are not exhaustive and/or exclusive. Rather, they are presented to assist in understanding and teach the embodiments, and are not representative of all embodiments. As such, certain aspects of the disclosure have not been discussed herein. That alternate embodiments may not have been presented for a specific portion of the innovations or that further undescribed alternate embodiments may be available for a portion is not to be considered to exclude such alternate embodiments from the scope of the disclosure. It will be appreciated that many of those undescribed embodiments incorporate the same principles of the innovations and others are equivalent. Thus, it is to be understood that other embodiments may be utilized and functional, logical, operational, organizational, structural and/or topological modifications may be made without departing from the scope and/or spirit of the disclosure. As such, all examples and/or embodiments are deemed to be non-limiting throughout this disclosure.

Also, no inference should be drawn regarding those embodiments discussed herein relative to those not discussed herein other than it is as such for purposes of reducing space and repetition. For instance, it is to be understood that the logical and/or topological structure of any combination of any program components (a component collection), other components and/or any present feature sets as described in the figures and/or throughout are not limited to a fixed operating order and/or arrangement, but rather, any disclosed order is exemplary and all equivalents, regardless of order, are contemplated by the disclosure.

Various concepts may be embodied as one or more methods, of which at least one example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments. Put differently, it is to be understood that such features may not necessarily be limited to a particular order of execution, but rather, any number of threads, processes, services, servers, and/or the like that may execute serially, asynchronously, concurrently, in parallel, simultaneously, synchronously, and/or the like in a manner consistent with the disclosure. As such, some of these features may be mutually contradictory, in that they cannot be simultaneously present in a single embodiment. Similarly, some features are applicable to one aspect of the innovations, and inapplicable to others.

In addition, the disclosure may include other innovations not presently described. Applicant reserves all rights in such innovations, including the right to embodiment such innovations, file additional applications, continuations, continuations-in-part, divisionals, and/or the like thereof. As such, it should be understood that advantages, embodiments, examples, functional, features, logical, operational, organizational, structural, topological, and/or other aspects of the disclosure are not to be considered limitations on the disclosure as defined by the embodiments or limitations on equivalents to the embodiments. Depending on the particular desires and/or characteristics of an individual and/or enterprise user, database configuration and/or relational model, data type, data transmission and/or network framework, syntax structure, and/or the like, various embodiments of the technology disclosed herein may be implemented in a manner that enables a great deal of flexibility and customization as described herein.

All definitions, as defined and used herein, should be understood to control over dictionary definitions, definitions in documents incorporated by reference, and/or ordinary meanings of the defined terms.

As used herein, in particular embodiments, the terms "about" or "approximately" when preceding a numerical value indicates the value plus or minus a range of 10%. Where a range of values is provided, it is understood that each intervening value, to the tenth of the unit of the lower limit unless the context clearly dictates otherwise, between the upper and lower limit of that range and any other stated or intervening value in that stated range is encompassed within the disclosure. That the upper and lower limits of these smaller ranges can independently be included in the smaller ranges is also encompassed within the disclosure, subject to any specifically excluded limit in the stated range. Where the stated range includes one or both of the limits, ranges excluding either or both of those included limits are also included in the disclosure.

The indefinite articles "a" and "an," as used herein in the specification and in the embodiments, unless clearly indicated to the contrary, should be understood to mean "at least one."

The phrase "and/or," as used herein in the specification and in the embodiments, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the embodiments, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the embodiments, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the embodiments, shall have its ordinary meaning as used in the field of patent law.

As used herein in the specification and in the embodiments, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the embodiments, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

While specific embodiments of the present disclosure have been outlined above, many alternatives, modifications, and variations will be apparent to those skilled in the art. Accordingly, the embodiments set forth herein are intended to be illustrative, not limiting. Various changes may be made without departing from the spirit and scope of the disclosure.

The invention claimed is:
1. A method, comprising:
receiving a first data;
in response to detecting that a file size of the first data is below a file size threshold, selecting a variable length codeword (VLC) encoder, the VLC encoder including a VLC table;

transforming, using the VLC encoder, the first data into a second data including a compressed version of the first data;
dynamically updating the VLC table in response to transforming the first data into the second data, the dynamically updating including shifting a table reference associated with the first data upward in a direction of a top of the VLC table; and
storing a digital representation of the second data in non-transitory memory.

2. The method of claim 1, further comprising storing an uncompressed version of the first data.

3. The method of claim 1, further comprising sending the digital representation to a converter to cause the second data to be transmitted via one of a wireless transmission, a wired transmission, or an optical transmission.

4. The method of claim 1, wherein the transforming the first data into the second data includes assigning a short codeword to frequently-occurring segments of the first data, and assigning a longer codeword to less frequently occurring segments of the first data.

5. The method of claim 1, wherein the transforming the first data into the second data includes retrieving, based on a segment of the first data, a codeword.

6. The method of claim 1, wherein the transforming the first data into the second data includes storing a representation of a segment of the first data in response to unsuccessfully querying for the segment.

7. The method of claim 1, further comprising multiplexing the digital representation of the second data with at least one hash table codeword to produce a hybrid bitstream.

8. The method of claim 1, wherein the VLC table is a pre-compiled VLC table that is customized for a specific file type.

9. The method of claim 1, wherein selecting the (VLC) encoder is performed using an artificial intelligence (AI) algorithm.

10. The method of claim 1, further comprising sending the digital representation of the second data to a training data generator for use in generating training data for a machine learning platform.

* * * * *

UNITED STATES PATENT AND TRADEMARK OFFICE
CERTIFICATE OF CORRECTION

PATENT NO. : 10,979,071 B2
APPLICATION NO. : 16/691496
DATED : April 13, 2021
INVENTOR(S) : Nicolas Thomas Mathieu Dupont et al.

It is certified that error appears in the above-identified patent and that said Letters Patent is hereby corrected as shown below:

In the Specification

At Column 7, Line 22, "encoder" should instead read --VLC encoder--
At Column 9, Line 29, "525" should instead read --526--
At Column 9, Line 31, "\TLC" should instead read --VLC--
At Column 9, Line 37, "encoder" should instead read --VLC encoder--
At Column 11, Line 39, "die" should instead read --the--
At Column 12, Line 58, "VIE" should instead read --VLC--

Signed and Sealed this
Twenty-ninth Day of June, 2021

Drew Hirshfeld
*Performing the Functions and Duties of the*
*Under Secretary of Commerce for Intellectual Property and*
*Director of the United States Patent and Trademark Office*